United States Patent
Small et al.

(10) Patent No.: US 7,968,465 B2
(45) Date of Patent: Jun. 28, 2011

(54) PERIODIC ACID COMPOSITIONS FOR POLISHING RUTHENIUM/LOW K SUBSTRATES

(75) Inventors: Robert J. Small, Tucson, AZ (US); Haruki Nojo, Kanagawa-ken (JP); Kenichi Orui, Atsugi (JP); Steve Masami Aragaki, Kawasaki (JP); Atsushi Hayashida, Yokohama (JP)

(73) Assignee: DuPont Air Products NanoMaterials LLC, Allentown, PA (US)

( * ) Notice: Subject to any disclaimer, the term of this patent is extended or adjusted under 35 U.S.C. 154(b) by 907 days.

(21) Appl. No.: 10/568,077

(22) PCT Filed: Aug. 12, 2004

(86) PCT No.: PCT/US2004/025913
§ 371 (c)(1),
(2), (4) Date: Aug. 3, 2007

(87) PCT Pub. No.: WO2005/019364
PCT Pub. Date: Mar. 3, 2005

(65) Prior Publication Data
US 2008/0038995 A1 Feb. 14, 2008

Related U.S. Application Data

(60) Provisional application No. 60/494,954, filed on Aug. 14, 2003, provisional application No. 60/494,955, filed on Aug. 14, 2003.

(51) Int. Cl.
*H01L 21/302* (2006.01)
*H01L 21/461* (2006.01)
(52) U.S. Cl. .......... 438/692; 438/689; 438/693
(58) Field of Classification Search .......... None
See application file for complete search history.

(56) References Cited

U.S. PATENT DOCUMENTS

| | | | |
|---|---|---|---|
| 5,358,889 A * | 10/1994 | Emesh et al. | 438/3 |
| 5,993,686 A | 11/1999 | Streinz et al. | |
| 6,043,159 A * | 3/2000 | Jacquinot et al. | 438/693 |
| 6,063,306 A | 5/2000 | Kaufman et al. | |
| 6,258,140 B1 * | 7/2001 | Shemo et al. | 51/308 |
| 6,261,967 B1 * | 7/2001 | Athavale et al. | 438/717 |
| 6,316,365 B1 * | 11/2001 | Wang et al. | 438/692 |
| 6,328,774 B1 | 12/2001 | Shemo et al. | |
| 6,332,831 B1 | 12/2001 | Shemo et al. | |
| 6,355,075 B1 * | 3/2002 | Ina et al. | 51/308 |
| 6,461,227 B1 | 10/2002 | Fang | |
| 6,527,622 B1 | 3/2003 | Brusic et al. | |
| 6,746,498 B1 * | 6/2004 | Buehler | 51/308 |
| 7,524,346 B2 * | 4/2009 | Small et al. | 51/307 |
| 2002/0076932 A1 | 6/2002 | Dirksen et al. | |
| 2002/0125460 A1 | 9/2002 | Tredinnick | |
| 2003/0060135 A1 | 3/2003 | Moeggenborg et al. | |
| 2003/0119319 A1 * | 6/2003 | Sinha et al. | 438/691 |

FOREIGN PATENT DOCUMENTS

| | | |
|---|---|---|
| EP | 1 283 250 | 2/2003 |
| EP | 1 405 886 | 4/2004 |
| WO | WO 03/064551 | 8/2003 |

OTHER PUBLICATIONS

G.B. Basim, Effect of Particle Size of Chemical Mechnical Polishing Slurries for Enhanced Polishing with Minimal Defects, 2000, vol. 147, pp. 3523-3528.*

* cited by examiner

*Primary Examiner* — Duy-Vu N Deo
*Assistant Examiner* — Stephanie Duclair
(74) *Attorney, Agent, or Firm* — John R. Dodd; Geoffrey L. Chase

(57) ABSTRACT

A method of polishing a semiconductor substrate surface having at least one ruthenium feature thereon and at least one dielectric material, wherein the substrate is contacted with an aqueous composition containing from about 0.0005 to about 1 moles/kilogram of periodic acid, from about 0.2% to about 6% % by weight of silica abrasive having an average particle size of about 50 nm or less, and an amine in an amount sufficient to adjust the pH of the composition to between about 2.5 and 7. The removal selectivity of the ruthenium to a. low-K dielectric is greater than 20:1. Advantageously, the substrate further has a tantalum-containing compound, and the polishing rate of the tantalum-containing compound is about the same as the polishing rate of the ruthenium, so that the polishing process is a one-step process.

22 Claims, No Drawings

PERIODIC ACID COMPOSITIONS FOR POLISHING RUTHENIUM/LOW K SUBSTRATES

This application is a continuation-in-part of U.S. patent application Ser. No. 10/057,206, filed Jan. 25, 2002, the contents of which are incorporated herein by reference, and also claims priority to U.S. Provisional Application 60/494,954 filed Aug. 14, 2003 and U.S. Provisional Application 60/494,955 filed Aug. 14, 2003, the contents of which are both incorporated herein by reference.

The present invention relates generally to compositions and associated methods for chemical-mechanical planarization of substrates having surface features comprising noble metals, noble metal alloys, noble metal compounds, and/or combinations thereof. The application specifically relates to a one-component, single-step, periodic acid-based chemical-mechanical polishing formulation and method useful for structures comprising barrier materials such as tantalum oxide, features comprising polysilicon, and features comprising ruthenium, typically disposed over a low-K dielectric such as TEOS, PETEOS, or combinations thereof, which may also advantageously comprise a silicon nitride stopping layer. One embodiment of this invention is particularly useful for substrates having a low-K component, e.g., TEOS or PETEOS, a ruthenium metal component, and a barrier component, e.g., tantalum oxide ($Ta_2O_5$), and optionally a polysilicon component, where it is desired not to remove TEOS, to have variable (and controllable) removal of the polysilicon, and to have reasonably similar removal rates for the Ru metal and the barrier, e.g., tantalum oxide, components.

Chemical-Mechanical Planarization, also referred to as Chemical-Mechanical Polishing or as simply CMP, is commonly used in the manufacture of semiconductor devices and denotes the process of removing material and forming a substantially planar surface before additional layers are deposited and/or additional patterning of the layers occurs. An accepted method of polishing semiconductor devices involves polishing a surface of the semiconductor with a polishing composition and a polishing pad. In a typical CMP process, a wafer is pressed against a polishing pad in the presence of the polishing composition which is known as a slurry if it contains abrasives or is known as a composition if it is free of abrasives, under controlled chemical, pressure, velocity, and temperature conditions. The polishing composition generally contains small, abrasive particles that abrade the surface of the wafer in a mixture with chemicals that oxidize and/or otherwise act upon the newly formed surface of the wafer.

CMP processes have been extensively studied for use in semiconductor fabrication and constitute integral steps in many practical production environments. However, CMP of metals has been studied most extensively in connection with metals such as tungsten, copper, aluminum, tantalum, among others, as well as oxides, nitrides and alloys thereof. In contrast, CMP of noble metals, including alloys and oxides thereof, is much less well studied. The term "noble metals" typically refers to less reactive metals such as gold, silver, platinum, iridium and other elements typically found in or near Group VIII of the periodic table. Interest in noble metals, and the alloys and oxides thereof, is increasing as such materials are useful as electrode and barrier materials in the fabrication of some electronic devices such as Gigabit ($10^9$ bit) DRAMs (dynamic random access memories) and FeRAMs (ferroelectric random access memories). Worldwide efforts are underway to commercialize high dielectric constant and ferroelectric thin films for use in capacitive elements as would be applied, for example, in advanced DRAMs and FeRAMs. High dielectric constant materials such as $BaSrTiO_3$ (BST) can be used for forming capacitor dielectrics in submicron integrated circuits (e.g. in DRAM storage capacitors, coupling capacitors in general circuits, among other uses). Additionally, ferroelectric materials such as $PbZrTiO_3$ (PZT) and $SrBi_2Ti_2O_9$ that can store charge for extended periods of time can be employed in the fabrication of non-volatile FeRAM memory elements. The chemical properties of these (and other) high dielectric constant and ferroelectric materials typically require that they be used in conjunction with noble metals, noble metal oxides and/or noble metal alloys (including Pt, Ir, $IrO_2$, among others). Examples of the use of high dielectric constant and/or ferroelectric materials in semiconductor fabrication and in conjunction with noble metals are also known.

Conventional patterning of noble metals, noble metal alloys, and noble metal oxides includes the use of dry etching processes. However, dry etching has several disadvantages including unfavorable taper angle, fence formation, and a tendency to produce residual particles leading to contamination. Some of these disadvantages of conventional dry etching are due to the predominantly physical rather than chemical mechanism for material removal. Physical removal of material is prone to the formation of unwanted structures at the edges of the structures, such as electrodes, being etched.

The present invention is in one embodiment directed to a CMP process of substrates comprising at least one of a conductive element comprising a noble metal, e.g., platinum, iridium, or ruthenium, and one dielectric component, comprising contacting the substrate with a composition of the invention disposed between the substrate and a polishing pad, and moving the polishing pad relative to the substrate to polish the substrate. When the substrate comprises or has an element, this means those components are or will be exposes to the CMP compositions of this invention at some point during the CMP process.

An important object of the present invention is to provide a one-step or finishing step composition and method for polishing a substrate comprising a ruthenium structure, a tantalum oxide structure, and optionally a polysilicon (or other hard mask) structure, which is disposed on a low-K dielectric material, wherein: the polishing rate of the ruthenium is economically feasible, e.g., greater than 300 angstroms per minute, preferably greater than about 500 angstroms per minute; wherein the polishing rate of the ruthenium is approximately the same as the polishing rate of the metal oxide, e.g., wherein the polishing rate of tantalum oxide is between about 0.8 and 1.7 times, preferably between about 0.9 and 1.3 times; more preferably between about 0.95 and 1.1 times the polishing rate of ruthenium; and the polishing rate of the hardmask material is equal to or greater than the polishing rate of the ruthenium, for example wherein the polysilicon polishing rate is between 1.0 and 3 times the ruthenium polishing rate). Advantageously, the selectivity of the composition to ruthenium over the low K dielectric material, e.g., TEOS, PETEOS, and the like, is at least 5:1, preferably at least 10:1, more preferably at least 20:1. The application specifically relates to a one-component, single-step, periodic acid-based chemical-mechanical polishing formulation and method useful for structures comprising materials such as tantalum oxide, polysilicon, and features comprising ruthenium, typically disposed over a low-K dielectric such as TEOS, PETEOS, or combinations thereof, which may also advantageously comprise a silicon nitride stopping layer.

Generally, the present invention is one or more of:

A. a method of polishing a substrate surface having at least one feature thereon comprising ruthenium and at least one dielectric material, comprising: providing an aqueous composition comprising from about 0.0005 to about 1 moles/kilogram of periodic acid and from about 0.2% to about 6% % by weight of silica abrasive having an average particle size of about 50 nm or less, wherein the aqueous composition is disposed between a polishing pad and the substrate; and moving the polishing pad relative to the substrate surface, where the removal rate of the ruthenium is at least 300 A/min;

B. a method of polishing a substrate surface having at least one feature thereon comprising ruthenium and at least one layer comprising a low-K dielectric, comprising: contacting the substrate with a silica abrasive and with an aqueous composition comprising periodic acid and a quaternary amine, wherein the solution has a pH of about 2.5 to about 5; and chemically mechanically polishing the substrate to remove a portion of the ruthenium, wherein the removal selectivity of the ruthenium to the low-K dielectric is greater than 20:1;

C. a method of polishing a substrate surface having at least one feature thereon comprising ruthenium and at least one feature comprising tantalum oxide, comprising: providing an aqueous composition comprising from about 0.1% to about 3% by weight periodic acid, from about 0.2% to about 6% % by weight of silica abrasive having an average particle size of about 50 nm or less, wherein the aqueous composition is provided between a polishing pad and the substrate, and wherein the composition comprises less than about 0.5% of sources of chloride ions; and moving the polishing pad relative to the substrate surface, where the polishing rate of tantalum oxide is between about 0.8 and 1.7 times the polishing rate of ruthenium; and/or D. a method of polishing a substrate surface having at least one feature thereon comprising a noble metal, comprising providing an aqueous periodic acid solution having 0.0005 to about 1 moles/kilogram of periodic acid; adjusting the pH of the aqueous periodic acid to a pH of between about 3 and about 7 with a quaternary amine; adding from about 0.2% to about 6% % by weight of silica abrasive having an average particle size of about 50 nm or less to the pH-adjusted aqueous composition to form a polishing slurry; and contacting the substrate with the polishing slurry.

In any of the above embodiments, the substrate advantageously comprises a ruthenium feature and at least one of PETEOS dielectric, TEOS dielectric, or BSPG dielectric, and the removal selectivity of the ruthenium to the dielectric is greater than about 20:1. In any of the above embodiments, the composition advantageously comprises less than about 0.1% of sources of chloride ions. In any of the above embodiments, the silica abrasive advantageously is present in an amount between about 0.2% to about 4% by weight and the periodic acid is present in an amount from about 0.01 to about 0.05 moles/kilogram of aqueous composition. In any of the above embodiments, the silica abrasive advantageously is substantially spherical silica particles with a particle size of about 4 nanometers to about 25 nanometers. In any of the above embodiments, the silica abrasive advantageously is present in an amount between about 0.2% to about 1% by weight and the periodic acid is present in an amount from about 0.01 to about 0.05 moles/kilogram of fluid. In any of the above embodiments, the aqueous composition advantageously further comprises an amine in an amount sufficient to adjust the pH to between about 3 and about 7. In any of the above embodiments, advantageously at least 50% of the weight of the silica should be in a chain-like structure with a length-to-width ratio of at least 4. Alternately, in any of the above embodiments, advantageously at least 50% of the weight of the silica should be in a aggregate with an aggregate diameter of about 03 to 0.05 microns before polishing. Another preferred alternative is wherein the silica abrasive comprises both silica particles in a chain-like structure with a length-to-width ratio of at least 4, and also silica particles in aggregates with an aggregate diameter of about 03 to 0.05 microns, wherein before polishing at least 70% of the weight of the silica is contained in the chain-like structures and the aggregates. In any of the above embodiments, advantageously the substrate further comprises a hard-mask material, and the polishing rate the polishing rate of the hardmask material is equal to or greater than the polishing rate of the ruthenium. In any of the above embodiments, advantageously the substrate comprises at least one of tantalum oxide or titanium oxide, and the polishing rate of the tantalum oxide and/or titanium oxide is between about 0.9 and 1.3 times the polishing rate of ruthenium. In any of the above embodiments, advantageously the pH of the aqueous composition is between about 3 and about 4. In any of the above embodiments, advantageously the aqueous composition consists essentially of water, periodic acid, one or more quaternary amines, and the silica abrasive, and the solution has a pH of about 2 to about 5. In any of the above embodiments, advantageously the polishing process is a one-step process. In any of the above embodiments, advantageously the composition is free of sources of chloride ions. In any of the above embodiments, advantageously the composition comprises from about 0.3% to 0.7% by weight of periodic acid. Finally, in any of the above embodiments, advantageously the polishing rate of ruthenium is greater than 500 angstroms per minute.

The present invention in one important embodiment provides compositions and processes for the CMP of substrates having at least one surface feature or layer comprising a noble metal, a noble metal alloy such as but not limited to Ru, Os, Rh, Ir, Pd, and Pt, a noble metal compound, or any combination thereof (sometimes referred to herein as noble metal features or the like). By comprising a noble metal it is meant that the noble metal is present in a feature in an amount of at least about 2 atomic percent, typically at least about 10 atomic percent, of at least one feature on the substrate, recognizing that the feature may be a much smaller fraction of the exposed substrate area. In preferred embodiments the composition structure comprises features made of more than 30 atomic percent ruthenium. The present invention provides chemical compositions and processes that increase the effectiveness of CMP processes for such substrates and/or ameliorate the challenges of treating waste streams in an environmentally friendly manner.

All compositions including slurries described herein have a solvent, advantageously a polar solvent. In preferred embodiments the solvent is water. Especially preferred are deionized water, ultrapure water, or such, where the amount of dissolved metals which can contaminate a substrate contained within the solvent are present in an amount less than 50 ppm, preferably less than 10 ppm, more preferably less than 1 ppm. Other polar solvents may be used, generally in combination with water, if particular low-K dielectric materials on the substrate are damaged by exposure to water.

All compositions including slurries described herein have periodic acid or salt thereof. In preferred embodiments the composition contains only one oxidizer, which is periodic acid. In an embodiment of the composition of the present invention, the periodic acid is present in an amount in a range of from about 0.0005 to about 1 moles/kilogram of fluid, for example between about 0.01 to about 0.3 moles/kilogram of fluid. In embodiments useful for iridium-containing substrates, the amount of periodic acid is preferably from about 0.075 to about 0.175 moles/kilogram. In embodiments useful for Ruthenium-containing substrates, the amount of periodic acid is preferably from about 0.01 to about 0.05 moles/kilogram, alternatively between about 0.1% to 0.9% by weight, for example between about 0.3% to about 0.7%, by weight of the fluid composition. A particularly preferred amount for very fine polishing of very small structures having ruthenium and having a tantalum oxide barrier layer has from 0.4% to 0.6%, i.e., about 0.5% of periodic acid. Such amount has been surprisingly found to provide adequate polishing rates of these very fine structures such as 0.1 to 0.8 nanometer gates and the barrier layers without damaging, corroding, or polishing the other material features in the gate, especially when used with silica abrasive material.

All CMP systems of this invention comprise an abrasive. The preferred abrasive is a metal oxide abrasive, which can be any suitable metal oxide that can function as an abrasive. Suitable metal oxides include alumina, silica, titania, ceria, zirconia, germania, magnesia, and combinations thereof. While it is recognized that the abrasive can be affixed to a polishing pad, this is often undesirable because uneven wear may result in areas of the pad having a deficiency of abrasive. The preferred compositions comprise abrasive suspended in a slurry. If the abrasive can be fixed (e.g., embedded), in whole or in part, in or on the polishing pad, the abrasives may be somewhat larger than those specified for slurries. Such fixation on the polishing pad can be accomplished, for example, by blending the abrasive into the aforementioned polymers during the formation of the polishing pad or by adhering the abrasive to the pad after the pad is formed using such adherents as are known.

The abrasive may be present in the slurry in an amount in a range of from 0.05% to 20% by weight, but preferably the amount of abrasive is from about 0.2% to about 6% % by weight, for example, from about 0.2% to about 4% % by weight, alternatively about 0.5% to 3% % by weight, wherein all percents are by weight of the slurry, i.e., the abrasive and the fluid composition.

Advantageously, the compositions used to polish ruthenium substrates are substantially free of hydrochloric acid and/or ammonium chloride, and other sourses of chloride ions. By substantially free we mean less than 0.5%, preferably less than 0.1%, for example between about 0 and about 0.05% by weight of the slurry. This is in contrast to compositions used to polish platinum, where such chloride sources can greatly increase polishing rates and selectivity.

An exemplary embodiment of the present invention is a composition for chemical-mechanical planarization that comprises periodic acid and an abrasive, present in a combined amount that is sufficient to planarize a substrate surface having at least one feature or layer thereon comprising a noble metal, a noble metal alloy, a noble metal oxide, or any combination thereof. Another exemplary embodiment of the present invention is a composition for chemical-mechanical planarization that consists essentially of periodic acid, a pH-control additive, and an abrasive, present in a combined amount that is sufficient to planarize a substrate surface having at least one feature or layer thereon comprising a noble metal, a noble metal alloy, a noble metal oxide, or any combination thereof. Another exemplary embodiment of the present invention is a composition for chemical-mechanical planarization that consists essentially of periodic acid, one or more of the additives described herein, and an abrasive, present in a combined amount that is sufficient to planarize a substrate surface having at least one feature or layer thereon comprising a noble metal, a noble metal alloy, a noble metal oxide, or any combination thereof. A preferred embodiment of the invention includes a process and formulation for chemical-mechanical polishing of substrates comprising contacting the substrate with a composition of the invention, and polishing the substrate. When the substrate comprises or has an element, this means those components are or will be exposes to the CMP compositions of this invention at some point during the CMP process. An exemplary embodiment of the present invention is a composition and method for chemical-mechanical planarization that comprises using periodic acid and an abrasive attached to a pad, present in a combined amount that is sufficient to planarize a substrate surface having at least one feature or layer thereon comprising a noble metal, a noble metal alloy, a noble metal oxide, or any combination thereof. Another preferred exemplary embodiment of the present invention is a composition for chemical-mechanical planarization that consists essentially of periodic acid, a pH-control additive, and an abrasive attached to a pad, wherein the composition and the abrasive are present in a combined amount that is sufficient to planarize a substrate surface having at least one feature or layer thereon comprising a noble metal, a noble metal alloy, a noble metal oxide, or any combination thereof. The abrasive can alternatively be both affixed to a pad AND be present in the slurry.

DETAILED DESCRIPTION OF EMBODIMENTS OF THE INVENTION

Substrates: The present invention is particularly suitable for polishing very high density semiconductor substrates, although it is equally useful for memory devices, memory disks, optical instruments, nanotechnology machines, and such where smooth surfaces are desired on substrates containing features on the order of 0.1 nanometer to several micron size. The substrate can comprise, consist essentially of, or consist of any suitable metal, metal oxide or other metal compound such as nitride or carbides, metal composite, dielectric, ferroelectric, organics, organometalics, or mixture thereof. The invention is particularly useful for substrates containing noble metals (as the term is used in the industry), alloys which include noble metals, and/or noble metal compounds including oxides and nitrides. The invention is also useful for more traditional metals, metal alloys, and metal compounds. The metals for which the invention is useful, in the semiconductor industry, include tungsten, titanium, aluminum, copper, tantalum, silver, gold, platinum, iridium, ruthenium, germanium, rhodium, palladium, and osmium. Selected embodiments are particularly useful for substrates comprising ruthenium and/or $RuO_2$, which may be used for example in a gate, as an electrode material of a capacitor, and the like. Other selected embodiments are particularly useful for iridium, iridium oxide, and platinum.

The preferred compositions described herein are suitable for use on substrates having strained silicon, polysilicon, single-crystal silicon, poly-crystalline silicon, amorphous silicon, silicon-on-insulator, and gallium arsenide.

The substrate can comprise, consist essentially of, or consist of any suitable metal oxide. Suitable metal oxides include, for example, alumina, silica, titania, ceria, zirconia, germania, magnesia, tungsten oxide, $Ta_2O_5$ and co-formed products thereof, and mixtures thereof, and combinations thereof. The composition can include TEOS, ferrodielectric material, and organic materials having a low dielectric constant ("low k"). The includes PZT ($PbZr_xTi_{1-x}O_3$), PLT, PLZT ($Pb_{1-y}La_yZr_xTi_{1-x}O_3$), SBT or BST ($Ba_xSr_{1-x}TiO_3$), where ($0<x<1$, $0<y<1$), $PbTiO_3$, $SrTiO_3$, $SrBi_2Ta_2O_9$ and/or $BaTiO_3$, $Ta_2O_5$.

The substrate can comprise barrier materials and adhesive materials. Certain metal, such as copper, have a great coefficient of diffusion in silicon and silica when undergoing an annealing step (thermal treatment step), which can adversely impact the material. The compositions and methods of this invention are useful for the traditional barrier materials, e.g., tantalum oxide, tantalum/tantalum oxide, titanium oxide, titanium/titanium oxide, and the like. A barrier can be an adhesive film, for example, a TaN film, a WN film or a layered film in which layers of Ti and TiN. Metal compounds include metal nitrides (e.g., silicon nitride, tantalum nitride, titanium nitride, and tungsten nitride), metal carbides (e.g., silicon carbide and tungsten carbide). Metal compounds include metal suicides. It is noted that some adhesive layers can comprise a noble metal. The compositions of this invention are suitable for use on for example $RuSi_xO_y$ deposited by for example chemical vapor deposition, atomic layer deposition, physical vapor deposition, or by forming a layer of ruthenium or ruthenium oxide over a silicon-containing region and performing an anneal to form $RuSi_xO_y$, where x and y are in the range of about 0.01 to about 5, for example where x is in the range of about 0.1 to about 3, say about 0.4, and where y is in the range of about 0.01 to about 0.1, say about 0.05. The adhesion layer may, additionally, include Ru and/or $RuSi_x$.

The substrate can include nickel-phosphorus, alumino-borosilicate, TEOS, borosilicate glass, phosphosilicate glass (PSG), borophosphosilicate glass (BPSG), SOS (silicon on sapphire), silicon-germanium alloys, and silicon-germanium-carbon alloys. The invention is not limited to semiconductor polishing; it also can be applied to glass substrates, including technical glass, optical glass, and ceramics, of various types known in the art. The term semiconductor as used herein means any devices including not only those formed over a silicon or gallium arsenide wafer but also those formed over a substrate such as TFT liquid crystal unless otherwise specifically indicated.

The invention is useful for substrates having one or more conductive metals, dielectric materials, barrier materials, and the like. However, the true invention is to find a single composition which is useful for particular combinations of the above components, especially tantalum oxide, ruthenium, poly-Si, TEOS and optionally an SiN stopper layer, where various combinations of the above are exposed at various times during the polishing. While the substrate may initially be covered with a single component, e.g., $Ta_2O_5$, as the oversputter is removed, the substrate will subsequently comprise features that have a plurality of components made of different materials, some components of which it is desirable to remove, some components of which it is not desirable to remove. It can be even more difficult to formulate compositions where, of the components which are desired to be removed (planarized) consists of two or more metals of different properties, for example platinum and ruthenium metal, or for example ruthenium metal and tantalum nitride, or the like. The combinations are substantially endless. For example, one embodiment of this invention is particularly useful for substrates having a TEOS component, a ruthenium metal component, and a tantalum oxide ($Ta_2O_5$) component, and optionally a polysilicon component, where it is desired not to remove TEOS, to have variable removal of the polysilicon, and to have reasonably similar removal rates for the Ru metal and the tantalum oxide components.

As the size of integrated circuits is reduced and the number of integrated circuits on a chip increases, the components that make up the circuits must be positioned closer together in order to comply with the limited space available on a typical chip. Current research, therefore, is directed towards achieving a greater density of active components per unit area of a semiconductor substrate. Suitable embodiments described herein are useful on substrates having noble-metal-containing substrate features on the order of from about 100 Angstroms (A) to about 2000 A thick, for example from 300 to 1000 A thick. The compositions and processes of the present invention are suitable for use in applications such as the polishing of these featured substrate surfaces at desirable polishing rates using standard CMP equipment. In such applications, a suitable polishing rate may be from about 300 Angstroms per minute (A/min) to about 2000 A/min, merely by way of example. Some compositions of this invention, particularly those having abrasive particles with diameter below about 20 nm, or chains made of such abrasive particles, are especially useful in polishing or planarizing a semiconductor device, for example, semiconductor devices having device feature geometries of about 0.25 micron or smaller (e.g., 0.18 micron or smaller).

As used herein, the chemical-mechanical planarization or polishing of a substrate having a metal feature or layer on its surface refers to the polishing of the substrate surface until the metal feature or layer is substantially coplanar with surrounding material, such as surrounding dielectric material, on the substrate. That is, the polishing of the metal-featured substrate continues until any metal excess is sufficiently removed to provide a substantially uniform profile across the substrate surface. Once the metal feature is substantially coplanar with surrounding material on the substrate surface, further polishing may take place. Preferably, the selectivity ratio of the CMP composition used in this further polishing process is close to 1:1, such that dishing and erosion of the metal feature and the surrounding material is avoided or minimized. Typically, each fabrication lab has standards of acceptable dishing and erosion for the polished wafers (typically measured using wafer profiling techniques), and generally prefers lower levels of dishing and erosion that indicate greater surface quality. By way of example, suitable surface uniformity (typically measured using known wafer profiling techniques) is reflected by wafer-within-wafer non-uniformity (WWNU) values of less than about 12%, preferably from about 4% to about 6%, or wafer-to-wafer non-uniformity (WTWNU) values of less than about 5%, preferably about 3%. Typically, each fabrication lab has acceptable uniformity values for each CMP process it uses, and generally prefers lower WWNU values or WTWNU values that indicate greater surface uniformity.

Preferably, the metal/dielectric selectivity of the CMP composition used in this planarization or polishing process is high (at least greater than 1:1, typically greater than 5:1, preferably greater than 10:1) in terms of the removal of metal relative to the removal of surrounding material or dielectric, where suitable selectivity ranges or values depend very much on the type of surrounding material or dielectric. In the case of non-noble metals, the industry expects a selectivity of the metal layer to the underlying substrate layer can be about 30:1 or higher. Noble metal layers tend to be mechanically difficult to polish and chemically resistant, and the removal rates for the underlying layers (e.g., insulating layer such as oxide) are often high under the conditions required to remove the noble metal, resulting in industry acceptance of selectivities as low as 1:1. Surprisingly, compositions of the present invention can give selectivities of Ruthenium to the dielectric that are greater than 5:1, typically greater than 30:1. By way of example, suitable selectivity ratios (i.e., removal of metal to removal of surrounding material or dielectric) may be on the order of between 50 and 100:1 for tetraethoxysilane (TEOS) and 20:1 for boron phosphorous silicate glass (BPSG).

Various CMP compositions are described herein in terms of the reactants and other chemical components that are mixed or otherwise combined to form the desired CMP slurry. However, it is recognized that a complex set of chemical processes typically follows blending of the CMP components that may destroy or alter, entirely or in part, one or more of the blended components. The CMP solutions of the present invention are described herein in terms of the blended components, with the understanding that the chemical composition (or range of compositions) of the resulting CMP slurry is the necessary result of chemical processes occurring between and among the blended components under the conditions specified. Thus, descriptions herein of the components blended to form a CMP slurry are intended to encompass the chemical species resulting from such blending under the condition (or set of conditions) specified. Various components of the slurry will be described in subsections herein.

ABRASIVE MATERIAL All CMP systems of this invention comprise an abrasive. While it is recognized that the abrasive can be affixed to a polishing pad, this is often undesirable because uneven wear may result in areas of the pad having a deficiency of abrasive. The preferred compositions comprise abrasive suspended in a slurry. The abrasive may be present in a slurry in an amount in a range of from 0.05 to 20%, but preferably the amount of abrasive is from about 0.2 to about 6 weight percent, for example, from about 0.2 to about 4 weight percent, alternatively about 0.5% to 3%, wherein all percents are by weight of the slurry, i.e., the abrasive and the fluid composition.

Examples of suitable abrasive particles include, but are not limited to, metal oxides including alumina, silica, ceria, titania, zirconia, manganese dioxide, other titanium oxides, yttrium oxide ($Y_2O_3$) particles, $Fe_2O_3$ particles; metal (of the metals listed in the preceding oxides) nitrides such as zirconium nitride; metal (of the metals listed in the preceding oxides) carbides, e.g., silicon carbide, titanium carbide, or tungsten carbide; metal (of the metals listed in the preceding oxides) silicides; or ceramics such as metal (of the metals listed in the preceding oxides) titanate, tantalate, zirconate, metal-germanium oxide, niobate, boride, or combinations thereof; boron carbide; spinel; polycrystalline diamond; garnet; carborundum), polymer/metal oxide composite, or mixtures of any of the above, some or all of which may optionally be coated or treated. The choice of abrasive can depend on the particular nature of the substrate being polished. Preferred abrasive particles include alumina, silica, and ceria. The most preferred abrasive is alumina for iridium; alumina, especially alpha alumina, for platinum, and silica for ruthenium. Various combinations of abrasive particles can be used if desired.

When abrasive size is mentioned, the size is the average particle diameter, which can be measured by for example microscopic examination, or by other techniques generally used in the industry. The surface area of the abrasives can vary widely, for example between 1 and 2000 square meters per gram, as measured by BET. When size ranges are specified, for example, from 10 to 80 nanometers, this means that the average particle size falls within those extremes, but preferably the individual particles have a size distribution such that substantially all particles, i.e., at least 95% by count (for a single mode composition) have sizes within 30%, preferably within 10%, of the average particle diameter. For the example of a slurry with a particle size of between 10 to 80 nanometers, a preferred composition may have an average particle size of 20 nanometers where at least 95% of particles have sizes between 14 and 26 nanometers, more preferably between 18 and 22 nanometers.

In preferred preparations, the silica particles have an average particle size of less than 120 nm, preferably having an average particle size of about 50 nm or less, more preferably about 20 nm or less, for example a composition where about 90% or more of the abrasive particles (by number) have a particle size less than 30 nm (e.g., a particle size of about 20 nm or less). These particle size preferences for the abrasive particles (i.e., whereby at least about 90%, 95%, 98%, substantially all, and all of the abrasive particles (by number) are less than or equal to a specific size of abrasive particle) also can pertain to other particle sizes, such as 25 nm, 20 nm, 15 nm, and 10 nm, 7 nm, and 4 nm.

Of course, in some embodiments of the invention, the particles are substantially monodispersed. One preferred composition has abrasive particles which are monodispersed and are of an average size which lies between 30 and 100 nanometers, where the material is single-mode or bimodal or trimodal.

It is known to use cocoon-shaped abrasive, which is generally defined in the industry as a particle where the length component is a factor of two or three times the width component. While it is possible to form cocoon-shaped particles of a single matrix, it is preferred to form the cocoon-shaped particles from 2 to 3 loosely bound smaller particles. One preferred composition has abrasive particles that are cocoon-shaped where 2 to 3 individual particles forming the cocoon are of an average size of between about 10 and 100 nanometers, for example between 15 and 25 nanometers.

The abrasive particles may form aggregates, which are particles loosely or strongly held together in clumps, where the number of particles in an aggregate depends largely on the chemistry of the composition and on the particle size. Aggregates have substantially the same dimensions, plus or minus 70%, measured in each direction, and have a plurality of particles interconnected such that a plurality of particles contact at least three other particles. Such aggregates can be desirable because they have high polishing rates as found with bigger particles but also have some resiliency, which reduces gouging. Particularly preferred for very fine features are abrasives in aggregate form with a particle size of 15 nanometers (0.015 microns) with an aggregate size of 0.03 to 0.05 microns, or abrasive with a particle size of 7 nanometers (0.007 microns) with an aggregate size of 0.02 to 0.04 microns.

We have surprising found that superior results are obtained with sub-0.05 micron minimum diameter, oblong-shaped, silica abrasive particles, particularly abrasive particle chains formed of a relatively small number of very small silica abrasive particles that adhere to one another to form a chain. As used herein, a chain is a structure with a length-to-width ratio of at least 4, preferably at least 6, and in some embodiments at least 10. The chain is not a single long crystal, but is a mass of small individual, preferably substantially spherical silica particles bound end to end. The chain width preferably substantially one particle, though in less preferred embodiment the width may between 2 and 4 particles, where the length to width ratio is based on the maximum width measured in a width direction. A particularly preferred chain is formed of particles having an average diameter of between 3 and 20 nanometers, for example between 5 and 12 nanometers, i.e., about 7 nanometers. Such chains are believed to have an effective size that is much larger than the average particle, but the chain structure is much more resilient than either an aggregate or a cocoon-shaped structure.

Of course, it is realized that formulations may and usually do contain a plurality of structures, be they monodispersed particles, cocoon shaped particles, cocoon-shaped particles formed of bound substantially spherical particles, chains, and aggregates. As used herein, when a structure is specified, at least 50% of the weight of abrasive should have that structure at least before polishing. When two or more structures are specified, at least 70% of the particles by weight should fall into the categories mentions, at least before polishing. In one embodiment of the present invention the polishing slurry for use in conjunction with the present method comprises a liquid carrier and silica particles as an abrasive. Suitable abrasive particles are commercially available and can be prepared by known methods, for example, by wet chemical methods such as condensation-polymerization or colloidal precipitation.

The percentage values used herein to describe the nature of the abrasive particles in terms of particle size are percentages "by number," rather than being weight percentages, unless otherwise noted. The particle size of any particle, particularly of the abrasive particles, refers to the median weight particle diameter. The particle size can be measured by any suitable technique. The particle size values set forth herein are based on a visual inspection, specifically by way of transmission electron micrography (TEM), of a statistically significant sample of the abrasive particles, preferably at least 200 particles.

ABRASIVE-SILICA: For certain substrates, particularly those containing ruthenium, silica abrasives are desired. Particle size of the silica can range from 3 microns to 3 nanometers. As is known in the art, fine control of particle size is needed to minimize defects. The silica abrasives for very fine features are by necessity also very fine. We have found that particles below 0.05 microns, preferably below 0.2 microns, are particularly useful. It is desirable in some embodiments to use substantially pure, i.e., ultra-high purity silica with less than 0.3 ppm metals, substantially spherical silica particles with a particle size of 4 nanometers (0.004 microns) to 25 nanometers is useful.

In some embodiments of the invention, the particles are substantially monodispersed. One preferred composition has 0.5 to 3% silica where the particles are monodispersed and are of an average size which lies between 30 and 100 nanometers, where the material is single-mode or bimodal or trimodal.

It is known to use cocoon-shaped silica, which is generally defined in the industry as a particle having one diameter be about 2 to 3 times the length of the diameters measured perpendicular to the long diameter, and having the appearance of clumps of between 2 and 3 individual particles, such that there is a length component that is a factor of two or three times a width component. While it is possible to form cocoon-shaped particles of a single matrix, it is preferred to use cocoon-shaped particles from 2 to 3 loosely bound smaller particles. One preferred composition has 0.5 to 3% silica where the particles are cocoon-shaped and the 2 to 3 individual particles forming the cocoon are of an average size of between about 10 and 100 nanometers, for example between 15 and 25 nanometers. The particles forming the cocoon-shaped chain advantageously have individual particle diameters within 20% of the weight median diameter of all the particles comprising the chain.

The particles may form aggregates, which are silica particles loosely or strongly held together in clumps, where the number of particles in an aggregate depends largely on the chemistry of the composition and on the particle size. For silica particles of average size of 15 nanometers, an aggregate may contain ten or more individual particles such that the aggregate size is about 40 microns. Aggregates have substantially the same dimensions, plus or minus about 70%, usually plus or minus about 30%, measured in each direction, and have a plurality of particles interconnected such that a plurality of particles contact at least three other particles. Such aggregates can be desirable because they have high polishing rates as found with bigger particles but also have some resiliency, which reduces gouging.

Particularly preferred for very fine features is silica in aggregate form with a particle size of 15 nanometers (0.015 microns) with an aggregate size of 0.04 microns, or silica with a particle size of 7 nanometers (0.007 microns) with an aggregate size of 0.02 microns.

We have also surprising found that superior results are obtained with chains formed of very small silica particles. As used herein, a chain is a structure with a length-to-width ratio of at least 4, preferably at least 6, and in some cases as much as at least 10. The chain is not a single long crystal, but is a mass of small individual, preferably substantially spherical silica particles bound end to end. The chain width substantially one and in less preferred embodiment between 2 and 3 particles measured in a width direction, and the length is at least 4 particles (for the single particle width). A particularly preferred chain is formed of particles having an average diameter of between 3 and 20 nanometers, for example between 5 and 12 nanometers, i.e., about 7 nanometers. Such chains are believed to have an effective size that is much larger than the average particle, but is much more resilient than either an aggregate or a cocoon-shaped structure It is realized that formulations may and usually do contain a plurality of structures, be they monodispersed particles, cocoon shaped particles, cocoon-shaped particles formed of bound substantially spherical particles, chains, and aggregates. As used herein, when a structure is specified, at least 50% of the weight of abrasive should have that structure at least before polishing. When two or more structures are specified, at least 70% of the particles by weight should fall into the categories mentions, at least before polishing.

ABRASIVE-ALUMINA: By way of example, the alumina may be an alpha-alumina, a gamma-alumina, fused alumina, ceramic alumina, or a combination thereof. Generally, different abrasives are useful for different substrates. Platinum may require an abrasice made of silica carbide, or alternately an alumina that is predominately alp-ha alumina, or fumed alumina. Iridium and iridium oxide can be polished with alpha alumina, and also be readily polished with colloidal alumina having a low alpha alumina content.

The alumina particles can comprise alpha alumina, preferably wherein the particles have a BET surface area between about 5 and 1000 $m^2/g$ and the average particle size is less than about 0.8 microns, say between about 0.05 and about 0.4 microns. Alternatively for very fine structures wherein the average alumina particle size is about 0.005 to about 0.03 microns, advantageously, the alumina abrasive material is in the form of cocoons or aggregates or even more preferably in the form of chains.

ABRASIVE-PAD: Any suitable polishing pad (e.g., polishing surface) can be used in conjunction with the inventive polishing method. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and co-formed products thereof, and mixtures thereof. As discussed above, the abrasive can be fixed (e.g., embedded), in whole or in part, in or on the polishing pad. In such case, the abrasives may be somewhat larger than those specified for slurries. Such fixation on the polishing pad can be accomplished, for example, by blending the abrasive into the aforementioned polymers during the formation of the polishing pad or by adhering the abrasive to the pad after the pad is formed using such adherents as are known.

In one embodiment, the polishing surface of the polishing pad further comprises a multiplicity of cavities which are thought to provide channels through which the polishing slurry can flow. Cavities includes recesses or indentations in the surface of the pad, protrusions arranged in such fashion as to form recesses between the protruding portions of the surface of the pad, or any combination of recesses and protrusions.

PERIODIC ACID: All compositions including slurries described herein have periodic acid or salt thereof. In preferred embodiments the composition contains only one oxidizer, which is periodic acid. In an embodiment of the composition of the present invention, the periodic acid is present in an amount in a range of from about 0.0005 to about 1 moles/kilogram of fluid, for example between about 0.01 to about 0.3 moles/kilogram of fluid.

In an embodiment of the composition of the present invention particularly useful for iridium, iridium oxide, and platinum, the periodic acid is present in an amount in a range of from about 0.05 to about 0.3 moles/kilogram, for example from about 0.075 to about 0.175 moles/kilogram, and the abrasive is present in an amount in a range of from about 0.2 to about 6 weight percent, or preferably, from about 0.2 to about 4 weight percent.

In embodiments useful for Ruthenium-containing substrates, particularly substrates having ruthenium features together with tantalum oxide layers or features, the amount of periodic acid is preferably from about 0.01 to about 0.05 moles/kilogram, alternatively between about 0.1% to 0.9% by weight, for example between about 0.3% to about 0.7%, by weight of the fluid composition. A particularly preferred amount for very fine polishing of very small structures having ruthenium has from 0.4% to 0.6%, i.e., about 0.5% of periodic acid, and the abrasive is present in an amount in a range of from about 0.2 to about 6 weight percent, or preferably, from about 0.2 to about 4 weight percent.

pH ADJUSTING ADDITIVE: The pH of the polishing slurry can be any suitable pH. The pH may affect performance and, therefore, generally is selected based upon the nature of the substrate being polished, including the chemical composition and topography of the substrate. The pH of the polishing slurry can be adjusted using any suitable pH adjusting agent. In most embodiments of the present invention, the composition or slurry comprises one or more acidic or basic pH-adjusting agents or titration agent in an amount sufficient to cause the pH level of the slurry to be in a desirable range. In other embodiments, both acidic and basic pH adjusting additives may be added to obtain a buffer effect. Generally, the amount of pH buffering additive is less than 5% by weight, preferably less than 1% by weight, more preferably less than 0.5% by weight, but subject to the condition that the amount is sufficient to obtain the desired pH.

When the CMP system is used to polish a copper-containing substrate, the pH may be about 4 to about 8. When the CMP system is used to polish a tantalum-containing substrate, the pH may be about 2 to about 8. When the CMP system is used to polish a substrate layer comprising tungsten, the pH may be about 1.5 to about 5. When the CMP system is used to polish a platinum-containing substrate, the pH may be about 2 to about 8. When the CMP system is used to polish an iridium-containing substrate, the pH may be about 1.5 to about 8, or from about pH 5 to about pH 10, for example from about pH 7 to about pH 9; or from about pH 1 to about pH 4, preferably from about pH 2 to about pH 3. The preferred pH for compositions used to polish ruthenium is from about pH 3 to about pH 7, for example from about pH 2 to about pH 5, preferably from about pH 4 to about pH 5 or about pH 3 to about pH 4.5.

Preferred basic pH-adjusting agents include one or more of a quaternary amine such as ammonium hydroxide and/or an alkyl substituted ammonium hydroxide, preferably tetramethylammonium hydroxide. The selection of particular amines for pH control is not important. As used in all embodiments of this invention, an alkyl substituted ammonium hydroxide has a formula $NR_4OH$, where R is independently H or a C1 to C7 alkyl or aryl moieties, where at most 3 of the 4 R moieties are hydrogen. Less preferred basic pH-adjusting agents can be an inorganic base, such as potassium hydroxide or sodium hydroxide; a salt of a monofunctional, difunctional, or trifunctional organic acid; or a hydroxylamine, hydroxylamine derivative (for example $NH_2OH$ optionally with one or more H being substituted with a C1 to C6 alkyl), or salts thereof. Mixtures of any of the above can be used.

In some cases, an acidic additive may be needed, though generally no acidic additive is added. Such additive is generally added when a buffering effect is desired. However, the periodic acid itself is an acidic additive useful for buffering. Other acidic additives that can be used include a mineral acid, for example nitric acid, hydrofluoric acid, sulfuric acid, hydrochloric acid, and/or phosphoric acid. The acidic additive can be a monofunctional, difunctional, or trifunctional organic acid.

Any combination of the above can be incorporated into a composition of the invention.

ADDITIONAL ADDITIVES: As stated, in many preferred embodiments of this invention, additional additives other than pH adjusting additives are not desired. However, additives are useful for certain substrates, as is known in the art. The metal oxide abrasive composition optionally can further comprise one or more other additives.

ADDITIONAL ADDITIVES—SUSPENSION AGENTS: In another embodiment, the compositions of this invention further comprises a suspension agent, which is preferably a surfactant. Such additives include surfactants, e.g., cationic surfactants, anionic surfactants, nonionic surfactants, amphoteric surfactants, fluorinated surfactants, and mixtures thereof, and polymeric stabilizers or other surface active dispersing agents. In another embodiment, the compositions of this invention are substantially free, i.e., contain less than 0.2, preferably none, of such suspension agents.

ADDITIONAL ADDITIVES—CORROSION INHIBITOR: Any suitable film-forming agent (e.g., corrosion-inhibitor) can be used in conjunction with the inventive method. For example, suitable film-forming agents generally include surface-active agents that preferentially adsorb to selected portions of the substrate. Therefore, suitable film-forming agents include, for example, amine-containing compounds such as primary, secondary, tertiary, and quaternary amines and amino acids, alkylamines, alkanolamines, hydrylamines, phosphate esters, sodium laurylsulfate, fatty acids, polyacrylates, polymethacrylates, polyvinylphosphonates, polymalate, polystyrenesulfonate, and polyvinylsulfonate. Other suitable film-forming agents include, for example, benzotriazole, triazole, benzimidazole, and mixtures thereof. In another embodiment, the compositions of this invention are substantially free, i.e., contain less than 0.2, preferably none, of such corrosion inhibitors.

ADDITIONAL ADDITIVES—CHELATORS: Any suitable complexing agent (i.e., chelating agent or selectivity enhancer) can be used in conjunction with the inventive method. Suitable complexing agents include, for example, carbonyl compounds (e.g., acetylacetonates), simple carboxylates (e.g., aryl carboxylates), carboxylates containing a hydroxyl groups (e.g., glycolates, lactates, gluconates, gallic acid), di-, tri-, and poly-carboxylates (e.g., oxalates, phthalates, citrates, succinates, tartrates, malates, edetates (e.g., EDTA), and carboxylates containing one or more sulfonic and/or phosphonic groups. Suitable chelating or complexing agents also can include, for example, di-, tri-, or poly-alcohols (e.g., ethylene glycol, pyrocatechol, pyrogallolp tannic acid, and the like) and phosphate-containing compounds, e.g., phosphonium salts, and phosphonic acids. Complexing agents also can include amine-containing compounds (e.g., amino acids, amino alcohols, di-, tri-, and poly-amines, and the like). Examples of amine-containing compounds include methylamine, dimethylamine, trimethylamine, ethylamine, diethylamine, triethylamine, ethanolamine, diethanolamine, diethanolamine cocate, triethanolamine, isopropanolamine, diisopropanolamine, triisopropanolamine, nitrosodiethanolamine, and mixtures thereof. Suitable amine-containing compounds further include ammonium salts (e.g., tetramethylamine and quatenary ammonium compounds).

It will be appreciated that many of the aforementioned compounds if containing a dissocable hydrogen can exist in the form of a salt, and can be useful for pH control.

Preferred chelating or complexing agents are compounds with carboxylate, hydroxyl, sulfonic, and/or phosphonic groups, di-, tri-, multi-, and poly-carboxylic acids and salts (such as tartaric acids and tartrates, glycolic acid, oxalic acid, malic acid and malates, malonic acid and malonates, gluconic acid and gluconates, citric acid and citrates, phthalic acid and phthalates, pyrocatecol, pyrogallol, gallic acid and gallates, tannic acid and tannates, and also EDTA and/or DPTA. In another preferred embodiment, the complexing agent is a cyclic diene, an organic amine, and combinations thereof. For selected noble metals, for example for a platinum-containing substrate, the composition preferably includes an organic amine and an organic chelating acid.

In another embodiment, the compositions of this invention are substantially free, i.e., contain less than 0.2, preferably none, of such chelators.

ADDITIONAL ADDITIVES—METAL-BASED ACCELERATORS: The compositions of this invention may comprise an accelerator, for example a small, i.e., less than 0.1% by weight, amount of an iron salt, for example ferric nitrate. The composition may comprise a small amount of one or more accelerators, which in addition to ferric salts include copper salts, silver salts, cerium salts, and the like. In preferred embodiments of the invention, the compositions of this invention are substantially free, i.e., contain less than 5 ppm, of such metal-based soluble accelerators.

ADDITIONAL ADDITIVES—NON-METAL-BASED ACCELERATORS: Other agent may be classified as accelerators or selectivity enhancers, for example aminoacetic acid and amidosulfuric acid. Several amino acids have been identified as useful in increasing the selectivity of compositions polishing selected noble metals. Several classes of amine-containing polymer can be accelerators for selected substrates, includng (1) an amine-containing polymer with about 5 or more sequential atoms separating the nitrogen atoms of the amino functional groups and/or (2) an amine-containing block copolymer with at least one polymer block comprising one or more amine functional groups and at least one polymer block not comprising any amine functional groups, i.e., a polyaminoamide of molecular weight between 1000 and 20000. Such compounds, if present, are beneficially present in an amount less than 5%, for example in an amount between 0.1 and 2%, by weight of the fluid composition.

In some embodiments, organosulfonates, for example HEDP or ATMP, are classified as oxidizers or selectivity enhancers, or alternately as chelators. Such compounds, if present, are beneficially present in an amount less than 1%, for example in an amount between 0 and 0.2%, by weight of the fluid composition.

We identified several agents that can specifically increase the polishing rate of ruthenium in an aqueous periodic acid-based composition, including acetic acid and/or nitric acid. Such compounds, if present, are beneficially present in an amount less than 2%, for example in an amount between 0 and 0.5%, by weight of the fluid composition.

ADDITIONAL ADDITIVES—RHEOLOGICAL AGENT: Any suitable rheological control agent can be used in conjunction with the inventive method, including viscosity enhancing agents and coagulants. Suitable rheological control agents include, for example, polymeric rheological control agents. Moreover, suitable rheological control agents include, for example, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof, and salts thereof. In another embodiment, the compositions of this invention are substantially free, i.e., contain less than 0.2, preferably none, of such rheological agents.

ADDITIONAL ADDITIVES—ADDITIONAL OXIDIZERS: Preferably, the only oxidizer present is periodic acid. Other oxidizers which are useful in some embodiments include chloric acid, perchloric acid, periodate salts, or iodic acid. Iodates are naturally present in a composition of periodic acid, and we have found iodates are useful in polishing selected noble metals, including ruthenium. By weight, iodates are less effective than periodic acid, but up to about 80% of the periodic acid in the formulations of this invention can be replaced with $IO_4^-$. As previously stated, some forms of hydroxylamine can be useful for pH control, but usually in quantities below 0.1% by weight.

In another embodiment, additional oxidizers can include at least one of hydrogen peroxide, hydrohydrogen peroxide, percarbonates, organic peroxides such as benzoyl peroxide, peracetic acid, monopersulfates and/or dipersulfates, and ozone. In another embodiment, the compositions of this invention are substantially free, i.e., contain less than 0.2% by weight, for example less than 0.1% by weight of the fluid composition, and preferably none, of oxidizers other than periodic acid. It is noted that during polishing, the consumption of the periodic acid will generate other iodine-containing species, but these are not considered to be additional oxidizers, even if there is a partial recycle such that such components are present "before polishing".

If one or more of the oxidizing agent(s) is/are not stable in a composition or slurry, the one or more oxidizers may be provided by separate delivery systems and/or in separate compositions and mixed at the point of use. In preferred embodiments of the invention, the only oxidizer present is periodic acid, and there are no stability concerns with the slurry.

ADDITIONAL ADDITIVES—ADDITIVES USED TO ALTER ABRASIVES: In most embodiments of this invention, the metal oxide abrasive is characterized by a total surface hydroxyl group density that is sufficiently low that adherence of the metal oxide abrasive to the substrate being polished therewith, particularly after subsequent cleaning, does not exceed a satisfactory level. Preferably, the metal oxide abrasive is characterized by a total surface hydroxyl group density of no greater than about 3 hydroxyl groups per $nm^2$. Most preferably, the total surface hydroxyl group density is no greater than about 2.5 hydroxyl groups per $nm^2$. Any suitable coupling agent can be used for the reduction of the surface hydroxyl density of metal oxide abrasives. Suitable coupling agents include, for example, silane coupling agents (i.e., methyltrimethoxysilane or hexamethyldisilazane) and R—Si—, aluminum coupling agents (i.e., acetoalkoxy aluminum diisopropylate), an organotitanium coupling agent (i.e., isopropyl-triisostearoyl titanate), and an organophosphorous coupling agent (i.e., dibutyl 2-methallyloxyethyl phosphate). Such materials are especially preferred at pH 7 or above for silica abrasives.

In another embodiment, the compositions of this invention are substantially free, i.e., contain less than 0.2, preferably less than 0.005% by weight based on the weight of the slurry, and most preferably none, of such abrasive treatments.

METHOD OF USE: In its most general form, the slurry of the invention is disposed between a polishing pad and the substrate, wherein the polishing pad exerts a force on the slurry-wetted substrate, and the polishing pad is moved relative to the substrate to affect a polishing action. The general method of use is to provide the composition or slurry in an amount typically between about 20 ml/min to 250 ml/min to a volume between a substrate and a polishing pad, with a small amount of pressure such as between 2 and 12 psi, at a temperature between about ambient and about 70° C., where the pad is moved relative to the substrate, for example by rotating the pad and/or rotating a platen on which the substrate is mounted, for example between about 10 and about 200 rpm for either or both. Use of the compositions and processes of the present invention may reduce, minimize or eliminate imperfections, defects, corrosion, recession and/or erosion that might otherwise appear on the substrate surfaces.

Merely by way of example, the compositions and processes of the present invention may be used to meet objectives such as providing metal-featured substrates, such as Ir- or $IrO_2$-featured substrates, that have a surface roughness of less than about 4 A and that are substantially corrosion-free, or providing metal-featured substrates that have dishing and erosion values of much less than 1000 A, such as less than about 500 A, for example, about 300 A.

The present invention further encompasses a substrate produced by the methods disclosed herein. According to various embodiments of the invention, the substrate is substantially planar following chemical-mechanical polishing, has a WWNU of less than about 12%, preferably less than 8%, for example less than 5%, and/or has a WTWNU of less than about 5% (one sigma).

For slurries having the periodic acid, PL-1 or PL-07 abrasive, and TMAH, the following characteristics were discovered.

A. Ru RR is most affected by pH, generally being between 300 and 400 angstroms per minute at pH 3 and about 600 to 700 angstroms per minute at pH 4 for the PL-07 abrasive. Increasing the amount of periodic acid, from 0.5% to 1.5%, increased the Ru RR about 50% for the PL-1 abrasive. The amount of abrasive has substantially no effect. Increasing the severity of the polishing parameters could increase the Ru RR, but at a cost of increasing non-uniformity.

B. Polysilicon RR is generally lower than the Ru RR with the PL-07 abrasive, and higher than the Ru RR with PL-1 abrasive. The goal is to have the polysilicon RR be higher than the Ru RR, because polysilicon is often used in thick layers as a mask. Increasing the silica content from 0.5% to 3% increased the polysilicon RR by about 50% to 150%, depending on the pH and on the abrasive. A smaller increase in the polysilicon RR can be obtained by decreasing the pH from 4 to 3, and this increase is muted when there is more silica abrasive present.

C. Tantalum oxide RR is generally higher than the Ru RR. Polishing at benign conditions lowers the tantalum oxide RR relative to the Ru RR.

D. TEOS RR is low with PL-I abrasive, and very low with PL-07 abrasive. The TEOS RR increases linearly with increasing silica content.

Below are a series of compositions and/or slurries particularly adapted to polishing substrates comprising ruthenium features. Compositions, associated methods, and substrates produced by such methods, according to the present invention are set forth in this description. In the examples set forth below, all numerical values and ranges are approximate unless explicitly stated otherwise.

The Ru polishing compositions preferably have periodic acid is present in an amount in a range of from about 0.0005 to about 1 moles/kilogram of fluid, for example between about 0.01 to about 0.3 moles/kilogram of fluid, preferably from about 0.01 to about 0.05 moles/kilogram of fluid, alternatively between about 0.01% to 3%.

The Ru polishing compositions preferably comprise silica abrasive.

The Ru polishing compositions preferably have a pH between 2 and 8, typically between 2 and 7, more preferably between 3 and 5.5, and have one or more pH adjusting additives in an amount necessary to obtain that pH. At pH 7, there can be higher polishing rates of some noble metals, but the desired feature of having the several components that form a structure on a chip be polished at nearly the same rates.

One embodiment of this invention is particularly useful for substrates having a TEOS component, a ruthenium metal component, and a tantalum oxide ($Ta_2O_5$) component, and optionally a polysilicon component, where it is desired not to remove TEOS, to have variable removal of the polysilicon, and to have reasonably similar removal rates for the Ru metal and the tantalum oxide components. This would allow one composition to be used to polish the substrate, as opposed to the lengthy and costly process of having a first slurry to remove a first component and a second slurry to remove a second component. To be accepted by industry, such a composition would for example have a Ruthenium removal rate of at least 100 A/min, preferably at least 200 A/min, more preferably at least 300 A/minute, for example greater than 500 A/min. Advantageously the tantalum oxide removal rate is between 0.5 and 2 times, preferably between 0.8 and 1.4 times, the ruthenium removal rate; and the polysilicon removal rate is variable but can under acceptable conditions exhibit a polysilicon removal rate of at least 1.3 times, preferably at least 2 times, the ruthenium removal rate.

Alternately the ruthenium/tantalum oxide selectivity (ratio of removal rates of ruthenium to removal rates of tantalum oxide) is about 1, for example between about 0.5 and about 1.3, preferably between 0.8 and 1.2. Advantageously, this same composition should have a polysilicon/ruthenium selectivity of at least 1.3, preferably at least 2. The polishing composition should not substantially polish the high K material, i.e., PETEOS or TEOS material, on the substrate, such that the ruthenium/high K selectivity is greater than 2, preferably greater than 10. Compositions of the current invention that meet these criteria comprises between 0.1 and 0.9% by weight, for example between about 0.3% to about 0.7%, of periodic acid by weight of the fluid composition. A particularly preferred amount for very fine polishing of very small structures having ruthenium has from 0.4% to 0.6%, i.e., about 0.5% of periodic acid. The pH is adjusted to between 2 and 5.5, preferably between 3 and 5, for example between 3.5 and 4.5. The pH can be adjusted with any pH adjustor, though ammonium hydroxide and/or an alkyl substituted ammonium hydroxides are preferred. The preferred an alkyl substituted ammonium hydroxide in this invention is tetramethyl ammonium hydroxide. Such amount has been surprisingly found to provide adequate polishing rates of Ru metal and other components such as tantalum oxide without, corroding or polishing the high-K material such as TEOS features, especially when used with silica abrasive material, preferably the colloidal or condensed, substantially spherical, silica abrasives described herein with individual particle sizes below 30 nm, for example between 5 nm and 25 nm, in cocoon shape, aggregate shape, and/or in chain shape (giving a larger effective diameter). This composition can optionally contain one or more additives, but a preferred composition consists essentially of the abrasive, water, periodic acid, and one or more pH adjusting additives.

EXAMPLE 1

The following compositions, with a balance of water, were prepared and tested on substrates comprising TEOS, Ruthenium metal, Tantalum Oxide ($Ta_2O_5$), and polysilicon:

| Composition | 1-A | 1-B | 1-C |
|---|---|---|---|
| Periodic acid, % | 0.5 | 0.5 | 0.5 |
| Colloidal silica, % | 3.0 (PL-1)™ | 0.5 (PL-1)™ | 0.5 (PL-7)™ |
| TMAH, % | 0.01 | 0.01 | 0.01 |
| pH | 4 | 4 | 4 |

Both silica abrasives are commercially available from the Fuso Chemical Co., Ltd, Tokyo, Japan, The silica (PL-1)™ is a high purity substantially spherical colloidal silica with an average particle diameter of 15 nanometers and an aggregate size of about 40 nm. The silica (PL-7)™ is a high purity substantially spherical colloidal silica with an average particle diameter of 7 nanometers, where the version used was substantially in chain form with chains typically 1 particle wide and between 5 and 15 particles long.

The polishing rates at relatively benign polishing conditions were found to be 350 to 400 A/min (angstroms per minute) for the tantalum oxide, 300 to 350 A/min for the Ruthenium metal (present on the substrate as ruthenium metal but most likely converted to oxide forms during CMP removal), a polysilicone removal rate of 500 A/min. Raising the pH, for example to about 5 to about 7, increases the polysilicone removal rate.

Under more aggressive conditions (increased tool pressure and RPM) with an 80 second polishing time, the ruthenium removal rate was 710 A/min for example 1-A, 780 A/min for example 1-B, and 840 A/min for example 1-C, while the tantalum oxide removal rate exceeded 800 A/min for examples 1-A and 1-B, and was about 600 A/min for Example 1-C, and the Ruthenium/plasma-enhanced TEOS selectivity was about 40:1 for example 1-A, 3.5 for example 1-B, and 14 for example 1-C. The within wafer nonuniformity averaged about 8.8% for example 1-A, 9.1% for example 1-B, and 10.8% for example 1-C. No polysilicon was present during these tests.

In additional tests under other conditions, ruthenium removal rates of 700 to 900 A/min were observed, with non-uniformity ranging from 3% to 8% for example 1-A, 3.5% to 9% for example 1-B, and 6-11% for example 1-C. The Tantalum oxide/Ru selectivity was near 1, the polysilicon/Ru selectivity was about 2 to 2.2 for example 1-A, between 0.6 to 1.1 for example 1-B, and between 0.05 to 0.1 for example 1-C. Importantly, the Ru/TEOS selectivity was 15 to 20 for example 1-A, 40 to 50 for example 2-B, and a very surprising 80 to 130 for Example 2-C.

EXAMPLES 1-D TO 1-R

Additional tests evaluated the effects of pH at pH 3 and pH 4, and of abrasive concentration at concentrations of 0.5%, 1%, 3%, and under some conditions 5%. In many processes, one or more components can be altered during polishing to achieve desired rates for certain components, which is especially useful if there is a large amount of oversputter or a large layer of some component needing removal. The Periodic acid was fixed at 0.5% by weight, and the pH was altered by addition of TMAH such that the periodic acid concentration was the same. The data is presented below, where silica concentration is in weight % and removal rate RR is in A/min.

| PL-1 silica, pH 3 | 1-D | 1-E | 1-F |
|---|---|---|---|
| Abrasive, wt. % | 0.5 | 1 | 3 |
| Ru RR | 740 | 730 | 720 |
| TaOxide RR | >700 | >700 | >700 |
| Polysilicon RR | 770 | 1290 | 1950 |
| TEOS RR | 18 | 24 | 46 |

Surprisingly, at pH 3, the Ru removal rate was independent of or even declined at increased abrasive concentration. The polysilicon polishing rate, on the other hand, was greatly increased by adding abrasive within the range of 0.5% to 3% by weight. The TEOS polishing rate also increased by adding abrasive within the range of 0.5% to 3% by weight, though the magnitude of the polishing rate was much lower than for polysilicon. While there is Ru/TEOS selectivity degradation, there is much higher polysilicon/Ru selectivity with higher amounts of abrasive.

| PL-1 silica, pH 4 | 1-G | 1-H | 1-I | 1-J |
|---|---|---|---|---|
| Abrasive, wt. % | 0.5 | 1 | 3 | 5 |
| Ru RR | 850 | 820 | 780 | 850 |
| Polysilicon RR | | | 2050 | |
| TEOS RR | 10 | 20 | 36 | 64 |

Again, at pH 4, the Ru removal rate declined slightly with increased abrasive concentration, until at 5% abrasive, the removal rate of Ru recovered. There is substantial Ru/TEOS selectivity degradation as the amount of abrasive is increased, because the TEOS removal rate varied directly with the amount of abrasive in the slurry.

| PL-07 silica, pH 3 | 1-K | 1-L | 1-M | 1-N |
|---|---|---|---|---|
| Abrasive, wt. % | 0.5 | 1 | 2 | 3 |
| Ru RR | 390 | 480 | 340 | 320 |
| TaOxide RR | >800 | >800 | >800 | >800 |
| Polysilicon RR | 390 | 480 | 490 | 790 |
| TEOS RR | 12 | 16 | 18 | 30 |

The above examples used the PL-07 brand of 7 nm silica particles that were in the form of chains. Ru removal rates are about half of those seen with the 15 nm silica abrasive material of examples 1-D to 1-J, and varied but not systematically with abrasive concentration. While there is a trend of Ru/TEOS selectivity degradation, there is a Ru/polysilicon selectivity of 1 at 0.5% and it is variable to about 2.5 with higher amounts of abrasive. Additionally, the magnitude of TEOS removal is less than with the PL-1 abrasive. The chain-like silica abrasive allowed the polysilicon polishing rate to be brought into the same range as the ruthenium polishing rate, though it can be seen that the tantalum oxide polishing rate was still too high.

| PL-07 silica, pH 4 | 1-O | 1-P | 1-Q | 1-R | (Repeat)1-R |
|---|---|---|---|---|---|
| Abrasive, wt. % | 0.5 | 1 | 2 | 3 | 3 |
| Ru RR | 690 | 670 | 560 | 610 | 710 |
| TaOxide RR | >800 | >800 | >800 | >800 | >800 |
| Polysilicon RR | 66 | 76 | 160 | 840 | 640 |
| TEOS RR | 8 | 10 | 16 | 20 | 18 |

These samples used the 7 nm silica particles that were in the form of chains, at a pH of 4. Ru removal rates at pH 4 using this abrasive are about twice those of the same abrasive at pH 3, and almost equal to the Ru removal rates seen with the 15 nm silica abrasive material of examples 1-D to 1-J. While there is a trend of Ru/TEOS selectivity degradation with increased abrasive concentration, there is a huge variation of Ru/polysilicon selectivity which is beneficially systematic and ranges from 10 with 0.5% abrasive to about 0.8 with 3% abrasive. The two examples labeled 1-R showed that the polishing rates of the various components were approaching unity.

EXAMPLES 2-4

We earlier explained that the compositions of polishing slurries are given by the weight percent of ingredients added, but that components can interact one with another. Surprisingly, we found that even if the compositions of two slurries were identical, the method of preparing the slurry can have a substantial effect. Method A starts with an aqueous periodic acid solution, then adds silica, and then adjusts the pH with TMAH. Therefore, the silica is exposed to the low pH of the aqueous periodic acid solution in Method A. Method B starts with an aqueous periodic acid solution, then adjusts the pH with TMAH, and then adds silica. Surprising, the performance of slurries made according to methods A and B differ significantly, as shown in Example 2 to 4 below, which compares formulations made with method A versus method B for formulations having 0.5% periodic acid at pH 4.

|  | Example | |
|---|---|---|
|  | 2-A | 2-B |
| Method. | A | B |
| Abrasive | PL-1 | PL-1 |
| SiO$_2$, wt. % | 3 | 3 |
| Ru RR | 980 | 940 |
| Nonuniformity (%) | 7.5 | 3.3 |
| TaOxide RR | >800 | >800 |
| Polysilicon RR | 1500 | 2000 |
| TEOS RR | 58 | 54 |

It can be seen that the exposure of the silica to the unbuffered aqueous periodic acid solution caused a change in the polishing characteristics, lowering the polysilicon removal rate but at a price of substantially increasing the nonuniformity. Without being bound by theory, we believe the exposure to the aqueous periodic acid changed the tendency of the silica particles to agglomerate. In the next set of tests, the amount of silica was reduced from 3% by weight to 0.5% by weight. Of course, this beneficially reduced the TEOS polishing rate. But it reversed the non-uniformity problem, where particles that were exposed to aqueous periodic acid prior to addition of the base gave lower non-uniformity. Of course, the polysilicon polishing rate fell as the amount of silica was reduced, which is consistent with what has been observed in earlier tests. The tantalum oxide removal rate fell below that of ruthenium. Therefore, for a slurry to provide a polishing rate for ruthenium that is similar to that of tantalum oxide, the composition should have between 0.5% and 3% of a PL-1 type abrasive

|  | Example | |
|---|---|---|
|  | 3-A | 3-B |
| Method. | A | B |
| Abrasive | PL-1 | PL-1 |
| SiO$_2$, wt. % | 0.5 | 0.5 |
| Ru RR | 920 | 930 |
| Nonuniformity (%) | 3.4 | 8.9 |
| TaOxide RR | 590 | 550 |
| Polysilicon RR | 400 | 600 |
| TEOS RR | 18 | 20 |

While PL-1 showed higher polysilicon removal rates when the slurry is prepared by Method B, the PL-07 chain-like slurries show higher polysilicon polishing rates when the slurry is prepared by method B.

|  | Example | |
|---|---|---|
|  | 4-A | 4-B |
| Method. | A | B |
| Abrasive | PL-07 | PL-07 |
| SiO$_2$, wt. % | 0.5 | 0.5 |
| Ru RR | 780 | 770 |
| Nonuniformity (%) | 6.6 | 6.4 |
| TaOxide RR | >800 | >800 |
| Polysilicon RR | 64 | 28 |
| TEOS RR | 6 | 14 |

The results from Examples 2-4 show the biggest differences between the performance of slurries made according to Method A versus Method B occur in polysilicon removal rate, where Method A with the PL-I abrasive gives lower polysilicon removal rates than Method B. The benefits of this are somewhat diluted because in the lower TEOS removal rates Method A also shows lower TEOS removal rates than Method B. Additionally, the results of this set of experiments clearly shows that the polishing characteristics of the slurry are markedly affected by the type of abrasive, i.e., chains made of particles having diameter below 10 nanometers versus 40 nanometer in diameter aggregates of particles having diameters of 15 nanometers.

EXAMPLE 5

Various tests were run at higher periodic acid concentrations, where all slurries were made by Method B. Extremely high Ru removal rates were observed at periodic acid (PIA) concentrations of 1% and 1.5% by weight of the fluid composition.

|  | Example | | |
| --- | --- | --- | --- |
|  | 5-A | 5-B | 5-C |
| Method | B | B | B |
| Abrasive | PL-1 | PL-1 | PL-1 |
| $SiO_2$, wt. % | 0.5 | 3 | 3 |
| PIA, wt. % | 1.5 | 1 | 1.5 |
| Ru RR | >1300 | 1170 | >1300 |
| Nonuniformity (%) | — | 6.8 | — |
| TaOxide RR | >800 | >800 | >800 |
| Polysilicon RR | 330 | 2500 | 920 |
| TEOS RR | 12 | 58 | 34 |

Additionally, higher periodic concentrations increases the Ru/TEOS selectivity, by a factor of two, for a periodic acid concentration change from 1% to 1.5%, though the data is somewhat surprising as the TEOS rate was not expected to actually decrease as the amount of periodic acid increased. There is also a very substantial decrease in the polysilicon removal rate with increased periodic acid, and a greater than 2 increase in the Ru/polysilicon removal rates, for a periodic acid concentration change from 1% to 1.5%. Also surprising in these examples is that the Ru/tantalum oxide removal selectivity is greater than 1, which is a very important parameter if one is used adjacent to or as a barrier or adhesive for the other.

IR Polishing Compositions

EXAMPLE 6

A polishing composition, "Composition 6A", useful for polishing iridium pursuant to some embodiments of the present invention is comprised of an abrasive (typically an alumina) and periodic acid ($H_5IO_6$) in aqueous solution (advantageously in distilled or deionized water, referred to collectively herein as "DI" water). The component concentrations for Composition 6A are 2% alumina, 0.1 mol/1 kg periodic acid, and balance water. Thus, for example, a 10 kilogram mixture of Composition 6A may be prepared by combining 200 grams of an alumina (whether alpha-, gamma-, or a combination of alpha- and gamma-alumina) abrasive, 1 mole of periodic acid and the remaining of amount DI water. One form of alpha-alumina abrasive advantageously used in connection with some compositions herein is the commercial product "CR-30" manufactured by Baikowski Chimie Co. of Annacey Cedex 9, France. Other sources of alpha-alumina, as well as sources of gamma-alumina or alpha- and gamma-alumina, may also be utilized. Composition 6A typically has a pH range from about 1 to about 2.5, and favorably (in terms of performance), a pH of about 1.5. Generally, Composition 6A is prepared by adding the alumina abrasive (such as CR-30) to a container of DI water and subsequently adding the periodic acid ($H_5IO_6$). The composition is typically stirred continuously within the container during at least the time of the preparation of the composition.

CMP Process: A typical example of the mixing ratio, process, pH and the resulting measured removal rate associated with Composition 6A, in which "A/min" denotes Angstroms ($10^{-10}$ meter) of material removed per minute of processing, and the process parameters are pressure, backpressure, pad RPM, platen RPM, and slurry rate in ml/min, are: 4\10/50/51/150 process, pH was 1.5-2.5, and Ir Removal Rate was 288 A/min. The CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as the buff pad on the secondary platen of the polisher. Composition A was stirred thoroughly before and during its use.

When employed according to the process above, Composition 6A provided an Ir removal rate of approximately 288 Angstroms per minute. Additionally, Composition 6A provided an Ir removal rate of approximately 375 Angstroms per minute when carried out according to the above-described process with one variation, namely, applying a higher down force pressure of 6 psi. Furthermore, Composition 6A provided an Ir removal rate of approximately 400 Angstroms per minute when carried out according to the process set forth above with one variation, namely, applying a higher table speed of 70 rpm. Generally, high removal rates (in terms of the material targeted for removal) are preferred.

EXAMPLE 7

Example 7 tested Ir polishing compositions including TMAH, called Composition B. Other Ir polishing compositions (such as "Composition B") pursuant to some embodiments of the present invention comprise an alumina abrasive (alpha-, gamma-, or both), periodic acid ($H_5IO_6$), DI water, and a pH-adjusting agent, or a base, typically tetramethylammonium hydroxide (TMAH). Component concentrations for Composition B is 2 wt % Alpha-Alumina Abrasive, 0.1 mol/kg Periodic Acid, and balance of deionized water, titrated with Tetramethylammonium Hydroxide (TMAH) to a pH of approximately between 6 and 7. By way of example, a 10 kilogram mixture of Composition B may be prepared by combining 200 grams of an alumina abrasive, 1 mole of periodic acid and the remaining amount of DI water. This mixture is then titrated with the titration agent TMAH to obtain a final pH of about 6 to about 7. Composition B typically has a pH range from about 6 to about 7 and, advantageously (in terms of performance), a pH of about 7. Composition B is advantageously continuously stirred within the container during at least the period of composition preparation.

CMP Process: An example of the mixing ratio of Composition B, a 4/0/50/51/150 process, at pH 6-7, the resultant Ir removal rate was 325 A/min. In this example, the CMP process was carried out using an IPEC 472 polisher and employing a down force pressure of 4 psi, a back pressure of 0 psi, a table speed of 50 rpm, a carrier speed 51 rpm, and a composition flow rate of 150 ml/min. A stacked pad of IC-1000 over a Suba IV was used as the polishing pad on the primary platen, and a Polytex pad was used as the buff pad on the secondary platen. Composition B was stirred thoroughly before and during its use.

EXAMPLE 7

Example 7 investigated Ir polishing compositions including $NH_4OH$. Composition C had alpha-alumina abrasive at 2 wt %, Periodic Acid at 0.1 mol/1 kg, and balance of DI Water and sufficient ammonium hydroxide to give the desired pH. This mixture is titrated with titration agent $NH_4OH$ to obtain a final pH of about 6 to about 7. Other Ir polishing compositions pursuant to some embodiments to the present invention are comprised of an alumina (alpha-, gamma-, or both) abrasive, periodic acid ($H_5IO_6$), DI water, and a pH-adjusting agent or a base, such as ammonium hydroxide ($NH_4OH$). By way of example, 200 grams of an alumina abrasive, 1 mole of periodic acid and the remaining amount of DI water may be combined to provide a 10 kilogram mixture of Composition C. Generally, Composition C is prepared by adding the alumina abrasive (such as CR-30) to a container of DI water and subsequently adding the periodic acid ($H_5IO_6$). This mixture is then titrated with the titration agent $NH_4OH$ to obtain a final pH value of about 7. Composition C is advantageously stirred continuously within the container during at least the period of composition preparation.

CMP Process: An example of the mixing ratio, process, pH, removal rate and selectivity associated with Composition C is with a 5/0/90/50/150 process, at pH 6-7, the Ir removal rate was 360 A/min, and the Ir/TEOS selectivity was 1.8 to 1. In thi example, the CMP process was carried out using an IPEC 472 polisher and employing a down force pressure of 5 psi, a back pressure of 0 psi, a table speed of 90 rpm, a carrier speed 50 rpm, and a composition flow rate of 150 ml/min. A stacked pad of IC-1000 over a Suba IV was used as the polishing pad on the primary platen, and a Polytex pad was used as the buff pad on the secondary platen. Composition C was stirred thoroughly before and during its use. When employed according to this process, Composition C provided an Ir removal rate of approximately 360 Angstroms per minute. The Ir removal rates were compared with tetraethoxysilane (TEOS) removal rates, yielding a Ir:TEOS selectivity of 1.8:1. Generally speaking, high selectivity ratios (in terms of the material targeted for removal to another material) are preferred.

According to some embodiments of the present invention, other Ir polishing compositions (such as "Composition D") are comprised of an alumina (alpha-, gamma-, or both) abrasive, periodic acid ($H_5IO_6$), DI water and a pH-adjusting agent or base such as ammonium hydroxide ($NH_4OH$). Illustrative component concentrations for Composition D is 2 wt % Alpha-Alumina Abrasive, 0.1 mol/1 kg Periodic Acid, balance deionized water, Titrate with $NH_4OH$ to a pH of approximately 3. Composition D typically has a pH range from about 2 to about 4 and a favorable pH value of about 3. Generally, Composition D is prepared by adding the alumina abrasive (such as CR-30) to a container of DI water and subsequently adding the periodic acid ($H_5IO_6$). One example, using a 5/0/90/50/150 process, gave an Ir removal rate Ir RR 0f 320 A/min and IR:TEOS selectivity of 1:1.5.

In the example set forth above, the CMP process was carried out using an IPEC 472 polisher and employing a down force pressure of 5 psi, a back pressure of 0 psi, a table speed of 90 rpm, a carrier speed 50 rpm, and a composition flow rate of 150 ml/min. A stacked pad of IC-1000 over a Suba IV was used as the polishing pad on the primary platen, and a Polytex pad was used as the buff pad on the secondary platen. Composition D was stirred thoroughly before and during its use.

Ir Polishing Compositions Including Suspension Agents

Other examples of Ir polishing compositions pursuant to some embodiments of the present invention comprise one or more agents for making an improved suspension. Typically such suspension-improving agents (hereinafter, "suspension agents") include abrasives.

Composition E

For example, some such Ir polishing compositions (such as "Composition E") comprise the components of Composition D and a second abrasive as a suspension agent. By way of example, in some such Ir polishing compositions the second abrasive may be Alumina-C as a 15% suspension. Alumina-C is a product, Aluminumoxid C (CAS#1344-28-1), of Deguss-Huls AG, which is used to keep the slurry in suspension for a suitable, and preferably long period. Composition E contains 2 wt % Alpha-Alumina Abrasive, 0.1 mol/1 kg Periodic Acid, balance deionized water, titrated with $NH_4OH$ to a pH of approximately 3, and further comprising 0.9 wt % of Alumina-C (15% suspension). Composition E typically has a pH range from about 2 to about 4 and, advantageously, a pH of about 3. Generally, Composition E was prepared by adding the alpha-alumina abrasive (such as CR-30) to a container of DI water and subsequently adding the periodic acid ($H_5IO_6$). This mixture was then titrated with $NH_4OH$ to obtain a final pH value of about 3. Finally, the second abrasive was added. Continuous stirring is maintained during at least the period of composition preparation. Using Composition E with a 5/0/90/50/150 process at pH of 3-4 gave an Ir removal rate of 260 A/min, and the Ir/TEOS selectivity was 1:2.2.

In this example, the CMP process was carried out using an IPEC 472 polisher and employing a down force pressure of 5 psi, a back pressure of 0 psi, a table speed of 90 rpm, a carrier speed of 50 rpm, and a composition flow rate of 150 ml/min. A stacked pad of IC-1000 over a Suba IV was used as polishing pad on the primary platen, and a Polytex pad was used as the buff pad on the secondary platen. Composition E was stirred thoroughly before and during its use. When employed according to the process above, Composition E provided an Ir removal rate of approximately 260 Angstroms per minute. The Ir removal rates were compared with tetraethoxysilane (TEOS) removal rates, yielding a Ir:TEOS selectivity of 1:2.2.

Composition F

Other Ir polishing compositions (such as "Composition F") pursuant to the some embodiments of the present invention comprise the components of Composition C and a second abrasive as a suspension agent. In one such composition, a slurry suspension agent, Laponite (a product of Southwestern Clay Co. of Gonzales, Tex.) was used. Laponite is typically hydrous sodium lithium magnesium fluoro-silicate (Laponite B), hydrous sodium lithium magnesium silicate (Laponite D, RD, ED, HB, G, XLG), hydrous sodium lithium magnesium silicate modified with tetra sodium pyrophosphate (Laponite DS, RDS, XLS, S, JS, MS), or hydrous sodium lithium magnesium silicate treated to give a fluoride loading of 2000 ppm (Laponite DF). Although any of the types of Laponite can be used with comparable results, Laponite B was used in the example described below. Composition F contained 2.3 grams, or 0.1 mol/1 kg Periodic Acid, 84 grams water, $NH_4OH$ to a pH of approximately 7, 0.5 grams Laponite, and 12.5 grams, or about 2 wt % Alpha-Alumina Abrasive (CR-30 @ 16 wt %). In the preparation of Oxidizer A, the periodic acid ($H_5IO_6$) is added to a container of DI water (76 grams). This mixture is then titrated with pH-adjusting agent or titration agent $NH_4OH$ to a final pH value of about 7. This resultant mixture is referred to herein as Oxidizer A. Abrasive A is prepared by adding the Laponite and the alumina abrasive to eight grams of DI water. Continuous stirring is maintained during at least the period of composition preparation.

Composition G

Other Ir polishing compositions (such as "Composition G") pursuant to some embodiments of the present invention comprise the components of Composition C and a slurry suspension agent, such as the surfactant Darvan C. Darvan C is a commercial ammonium polymethacrylate aqueous solution sold by R. T. Vanderbilt Company, Inc. of Norwalk, Conn. Composition G contained 2.3 grams, or 0.1 mol/1 kg Periodic Acid, 76 grams plus 8 grams deionized water, $NH_4OH$ to a pH of approximately 7, 12.5 grams, or about 2 wt % Alpha-Alumina Abrasive (CR-30 @ 16 wt %), and 0.5 grams Darvan C. Oxidizer A is prepared as previously described in relation to Composition F. Abrasive B is prepared by adding the Darvan C and the alumina abrasive to eight grams of DI water. Oxidizer A is added to Abrasive B to produce Composition G. Continuous stirring is maintained during the composition preparation.

Composition H

Other Ir polishing compositions (such as "Composition H") pursuant to some embodiments of the present invention comprise the components of Composition C and a second abrasive as a suspension agent. In some embodiments, the second abrasive is LUDOX TM-50. LUDOX TM-50 is a commercial colloidal silica abrasive of E. I. Du Pont de Nemours and Company, having advantageous properties in terms of particle size and contribution to composition suspension and stability. Composition H contained 2.3 grams, or 0.1 mol/1 kg Periodic Acid, 76 grams plus 8 grams deionized water, $NH_4OH$ to a pH of approximately 7, 12.5 grams, or about 2 wt % Alpha-Alumina Abrasive (CR-30 @ 16 wt %), and 0.5 grams LUDOX TM-50. Generally, Composition H is prepared by combining ingredients in the same manner as was Composition G.

sive (CR-30 @ 16 wt %), and 1.0 gram of Succinic acid. The composition was prepared following the process described for composition G.

Composition K

Other Ir polishing compositions (such as "Composition K") pursuant to the present invention comprise the components of Composition C and a second abrasive as a suspension agent. In some embodiments, the second abrasive is an alumina abrasive in the form of "CR-140". Cr-140 is a commercial abrasive product manufactured by Baikowski Chimie Co. of Annacey Cedex 9, France, believed to comprise about 95% gamma-alumina and about 5% alpha-alumina. Composition K contained 2.3 grams, or 0.1 mol/1 kg Periodic Acid, 76 grams plus 3.5 grams deionized water, $NH_4OH$ to a pH of approximately 7, 12.5 grams, or about 2 wt % Alpha-Alumina Abrasive (CR-30 @ 16 wt %), and 5 grams of CR-140 @ 20 wt %. The composition was prepared following the process described for composition G. Composition K is prepared by combining Oxidizer A (prepared as previously described) and "Abrasive F". Abrasive F is prepared by adding CR-140 (the second abrasive) and CR-30 (the first abrasive) to 3.5 grams of DI water. Oxidizer A is added to Abrasive F to produce Composition K. Continuous stirring is maintained during the composition preparation.

Preparation conditions associated with Compositions F through K are set forth below in Table 1.

Compositions F through K Preparation Conditions

TABLE 1

| Composition | DI Water | Second Abrasive | First Abrasive | Stir Time | Oxidizer | Stir Time |
|---|---|---|---|---|---|---|
| Composition F | 8 grams | 0.5 grams Laponite | 12.5 grams | 2 hours | 79 grams Oxidizer A | >20 min. |
| Composition G | 8 grams | 0.5 grams Darvan C | 12.5 grams, | 2 hours | 79 grams Oxidizer A | >20 min. |
| Composition H | 8 grams | 0.5 grams LUDOX TM-50 | 12.5 grams | 2 hours | 79 grams Oxidizer A | >20 min. |
| Composition I | 8 grams | 0.5 grams Ethyl Carbonate | 12.5 grams | 2 hours | 79 grams Oxidizer A | >20 min. |
| Composition J | 7.5 grams | 1.0 grams Succinic acid | 12.5 grams | 2 hours | 79 grams Oxidizer A | >20 min. |
| Composition K | 3.5 grams | 5 grams CR-140 (20% wt) | 12.5 grams | 2 hours | 79 grams Oxidizer A | >20 min. |

Composition I

Other Ir polishing compositions (such as "Composition I") pursuant to some embodiments of the present invention comprise the components of Composition C and a slurry suspension agent. In some embodiments, the suspension agent is ethyl carbonate. Composition I contained 2.3 grams, or 0.1 mol/1 kg Periodic Acid, 76 grams plus 8 grams deionized water, $NH_4OH$ to a pH of approximately 7, 12.5 grams, or about 2 wt % Alpha-Alumina Abrasive (CR-30 @ 16 wt %), and 0.5 grams Ethyl Carbonate. The composition was prepared following the process described for composition G.

Composition J

Other Ir polishing compositions (such as "Composition J") pursuant to some embodiments of the present invention comprise the components of Composition C and an organic acid as a suspension agent. In one embodiment, the organic acid is succinic acid. In other embodiments, alternative water soluble organic acids (e.g. mono-, di-, and tri-functional acids) can be used, as can other suspension agents or surfactants that act to suspend the abrasive. Composition J contained 2.3 grams, or 0.1 mol/1 kg Periodic Acid, 76 grams plus 7.5 grams deionized water, $NH_4OH$ to a pH of approximately 7, 12.5 grams, or about 2 wt % Alpha-Alumina Abra- Table 2 below sets forth the pH, settling time, Ir removal rate and Ir:TEOS selectivity associated with Compositions F through K. As used herein, settling time refers to the time it takes for a homogenous slurry mixture to settle in an ambient environment so that a clear top layer is formed. In these examples, the unit of measure for settling time is millimeters of clear liquid (i.e., the depth of the clear top layer measured from the top of the original homogenous mixture) in a given unit of time. For instance, a settling time of 9 mm/10 min indicates that a 9 mm deep layer of clear liquid was formed after 10 minutes of standing in an ambient environment. Generally, a suitable slurry, such as any of the examples of Compositions F through K, should not settle in a relatively "hard" or packed manner such that the slurry can't be resuspended with minimal agitation.

For Ir polishing, Composition H is preferred in view of its favorable Ir removal rate of 240 A/min, and more particularly, its favorable 3.9:1 Ir:TEOS selectivity, which relatively high selectivity is believed to play an important role at the end of the polishing step. pH, Settling Time, Ir Removal Rate and Selectivity for Compositions F Through K

TABLE 2

| Composition | pH | Settling Time (mm/min) | Ir Removal Rate (A/min) | Ir:TEOS Selectivity |
|---|---|---|---|---|
| Composition F | 7.3 | 9 mm/10 min | 240 | 2.7:1 |
| Composition G | 7.3 | 9 mm/10 min | 340 | 2.1:1 |
| Composition H | 7.3 | 9 mm/10 min | 240 | 3.9:1 |
| Composition I | 7.3 | 9 mm/10 min | 350 | 2.3:1 |
| Composition J | 6.7 | 5 mm/2 hrs | 80 | 1:1.3 |
| Composition K | 6.9 | 10 mm/10 min | 230 | 3.4:1 |

Each of the CMP processes set forth in Table 2 above was carried out using an IPEC 576 polisher with a Thomas West XY pad and employing a down force pressure of 4 psi, a back pressure of 0 psi, a table or platen speed of 200 rpm, a carrier speed of 18 rpm, and a composition flow rate of 150 ml/min. Compositions F through K were stirred thoroughly before and during their use.

$IrO_2$ Polishing Compositions: Iridium oxide ($IrO_2$) polishing compositions (such as "Composition L") pursuant to some embodiments of the present invention comprise an alumina (alpha-, gamma-, or both) abrasive, hydrazine hydrate ($NH_2-NH_2.H_2O$), and DI water. Hydrazine hydrate is believed to contribute to the polishing of the noble metal oxide. Further, it is believed that the caustic hydrazine hydrate may also serve as a reducing agent, although this effect may be slight or minimal. According to the present invention, an $IrO_2$ polishing composition should have a pH of from about pH 5 to about pH 10, preferably, from about pH 7 to about pH 9, Composition L contained 2 wt % Alpha-Alumina Abrasive (CR-30), 0.1 mol/1 kg Hydrazine hydrate, and balance DI Water. Composition L typically has pH level of pH 8 or greater, such as from about pH 8 to about pH 10 and, advantageously, from about pH 9 to about pH 9.5. Composition L was prepared by adding the alumina abrasive (such as CR-30) to a container of DI water and subsequently adding the hydrazine hydrate. Composition L is typically continuously stirred within the container during at least the period of composition preparation. A 4/0/50/51/150 process with Composition L at pH 9-9.5 resulted in a $IrO_2$ Removal Rate of 880 A/min. In the example set forth in Table L, the CMP process was carried out using an IPEC 472 polisher and employing a down force pressure of 4 psi, a back pressure of 0 psi, a table speed of 50 rpm, a carrier speed 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. Composition L was stirred thoroughly before and during its use.

Another example of component concentrations for Composition L (denoted as "Composition L(a)") contained 2 wt % Alpha-Alumina Abrasive (CR-30), 0.05 mol/kg Hydrazine hydrate, and balance deionized water, at a pH value of about 9. A 4/0/50/51/150 CMP Process using Composition L(a) gave a $IrO_2$ Removal Rate of 740 A/min. In the example set forth in Table L(a), the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. The above Composition L(a) was stirred thoroughly before and during its use.

Composition M (for polishing $IrO_2$)

Other iridium oxide ($IrO_2$) polishing compositions (such as "Composition M") pursuant to some embodiments of the present invention are comprised of an alumina (alpha-, gamma-, or both) abrasive, tetramethylammonium hydroxide (TMAH), and DI water. TMAH is believed to contribute to the polishing of the noble metal oxide. Composition M contained 2 wt % Alpha-Alumina Abrasive (CR-30), 0.1 mol/1 kg Tetramethylammonium Hydroxide, and balance water. Composition M typically has a pH level of pH 8 or greater, such as in a range from about pH 9 to about pH 11 and, favorably, of about pH 10. Composition M was prepared by adding the alpha-alumina abrasive (CR-30) to a container of DI water and subsequently adding tetramethylammonium hydroxide (TMAH). Composition M is preferably continuously stirred within the container during at least the composition preparation. Using a 4/0/50/51/150 CMP Process, Composition M at pH 10 gave a $IrO_2$ polishing rate of 635 A/min. In the example set forth in Table M, the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. The Composition M of the example was stirred thoroughly before and during its use.

A "Composition M(a)" contained 2 wt % Alpha-Alumina Abrasive (CR-30), 0.03 mol/1 kg Tetramethylammonium Hydroxide, and balance water at a pH of about pH 9 to about pH 10. A 4/0/50/51/150 CMP process with Composition M(a) provided an $IrO_2$ removal rate of approximately 320 Angstroms per minute. Polishing conditions were the same as previously described.

Platinum (Pt) Polishing Compositions

Platinum (Pt) polishing compositions (such as "Composition N") pursuant to some embodiments of the present invention comprise an alumina abrasive (alpha-, gamma-, or both, but preferably alpha), periodic acid ($H_5IO_6$), and DI water. Thus, Composition N is comprised of the same components as Composition A, although the preferred quantities may vary from those preferred for iridium substrates. Composition N contained 2 wt % Alpha-Alumina Abrasive (CR-30), 0.1 mol/1 kg Periodic Acid, and balance deionized water, at a pH of about 1.6. Composition N was prepared by adding water the alumina abrasive (such as CR-30) to a container of DI and subsequently adding the periodic acid ($H_5IO_6$). Composition N is advantageously stirred continuously within the container during at least the period of composition preparation. A 2/200/18/150 CMP Process with Composition N at a pH of about 1.6 provides a Pt removal rate of 131 A/min and a Boron Phosphorous Silicate Glass (BPSG) removal rate of 180 A/min, demonstrating a Pt:BPSG selectivity of 1:1.5. In this example, the CMP process was carried out using an IPEC 576 polisher with a Thomas West XY pad and employing a down force pressure of 2 psi, a table or platen speed of 200 rpm, a carrier speed of 18 rpm, and a composition flow rate of 150 ml/min. Composition N was stirred thoroughly before and during its use.

Composition O: Other platinum polishing compositions (such as "Composition O") pursuant to some embodiments of the present invention comprise an alumina (alpha-, gamma-, or both) abrasive, periodic acid ($H_5IO_6$), ammonium chloride ($NH_4Cl$), and DI water. It is believed that the electrolyte, ammonium chloride, serves as a source of chloride ions that assist in metal etching. Composition O contained 2 wt % Alpha-Alumina Abrasive (CR-30), 0.1 mol/1 kg Periodic Acid, 0.1 mol/1 kg Ammonium Chloride, and balance deionized water, at a pH of from about 1.2 to about 1.8, typically about 1.6. Composition O was prepared by adding water the alumina abrasive (such as CR-30) to a container of DI and subsequently adding the periodic acid ($H_5IO_6$), and then adding the ammonium chloride. Composition O is advantageously stirred continuously within the container during the composition preparation. A 2/200/18/150 CMP Process with Composition O at a pH of about 1.6 provides a Pt removal rate of 443 A/min and a Boron Phosphorous Silicate Glass (BPSG) removal rate of 56 A/min, demonstrating a Pt:BPSG selectivity of 8:1. It can be seen that ammonium chloride increased the polishing rate of platinum by a factor of about 3, and increased the selectivity by a factor of about 5. For CMP compositions used to polish platinum, the composition advantageously comprises between about 0.01 mol/kg and about about 0.5 mol/kg Ammonium Chloride. The CMP process was carried out using an IPEC 576 polisher with a Thomas West XY pad and employing a down force pressure of 2 psi, a table or platen speed of 200 rpm, a carrier speed of 18 rpm, and a composition flow rate of 150 ml/min. Composition O was stirred thoroughly before and during its use.

Composition P: Other platinum polishing compositions (such as "Composition P") pursuant to some embodiments of the present invention comprise an alumina (alpha-, gamma-, or both) abrasive, periodic acid ($H_5IO_6$), ammonium chloride ($NH_4Cl$), and DI water. Composition P contained 6 wt % Alpha-Alumina Abrasive (CR-30), 0.1 mol/1 kg Periodic Acid, 0.1 mol/1 kg Ammonium Chloride, and balance deionized water, at a pH of from about 1.5 to about 2, typically about 1.7. Composition P was prepared by adding the alumina abrasive (such as CR-30) to a container of DI water, then adding the periodic acid ($H_5IO_6$), and then adding the ammonium chloride ($NH_4Cl$). Several polishing conditions (tool pressure) were used with this composition, and we found the platinum removal rate was highly dependent on the tool pressure, ranging from 220 A/min at a tool pressure of 2 psi to 1020 A/min at a tool pressure of 7 psi. That is, the CMP processes were carried out using an IPEC 576 polisher with a Thomas West XY pad and employing a down force pressure of 2 psi, 4 psi, 6 psi and 7 psi, respectively. All processes further employed a table or platen speed of 200 rpm, a carrier speed of 18 rpm, and a composition flow rate of 70 ml/min. Composition P was stirred thoroughly before and during its use. Composition provides Pt removal rates of 220 A/min, 470 A/min, 750 A/min, and 1,020 A/min, respectively.

Composition Q: Other platinum polishing compositions (such as "Composition Q") comprise an alumina abrasive (alpha-, gamma-, or both), ammonium chloride ($NH_4Cl$), and DI water, but no periodic acid. Composition Q contained 2 wt % Alpha-Alumina Abrasive (CR-30), 0.1 mol/1 kg Ammonium Chloride, and balance of deionized water, at a pH range from about 5 to about 6, typically about 5.4. Composition Q was prepared by adding the alumina abrasive (such as CR-30) to a container of DI water and then adding the ammonium chloride. Composition Q is typically stirred continuously within the container during the composition preparation. A 2/0/200/18/150 CMP Process was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition Q is advantageously stirred thoroughly before and during its use. Composition Q provides a Pt removal rate of 1,598 A/min and a BPSG removal rate of 145 A/min, demonstrating a Pt:BPSG selectivity of approximately 11:1. Preferred compositions for platinum therefore comprise ammonium chloride, alpha alumina, and water, but no periodic acid, or alternately from about 0.001 to 0.05 mol/kg periodic acid.

Composition R: Other Pt polishing compositions (such as "Composition R") pursuant to some embodiments of the present invention comprise an alumina (alpha-, gamma-, or both) abrasive, hydrochloric acid (HCl) and DI water. It is believed that the hydrochloric acid serves as a source of chloride ions that assist in the etching of metal. Composition R contained 2 wt % Alpha-Alumina Abrasive (CR-30), 0.1 mol/kg Hydrochloric Acid, and balance of deionized water, at a pH range from about 1 to about 2, typically about 1.2. Composition R was prepared by adding the alumina abrasive (such as CR-30) to a container of DI water and then adding the hydrochloric acid. Composition R is typically stirred continuously within the container during the composition preparation. A 2/0/200/18 CMP Process was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition R was stirred thoroughly before and during its use. When employed according to the process of Table R, Composition R provides a Pt removal rate of 334 A/min and a BPSG removal rate of 26 A/min, demonstrating a Pt:BPSG selectivity of 13:1.

Composition S: Other Pt polishing compositions (such as "Composition S") pursuant to some embodiments of the present invention comprise an alumina (alpha-, gamma-, or both) abrasive, hydrochloric acid (HCl), ammonium chloride ($NH_4Cl$), and DI water. Composition S contained 2 wt % Alpha-Alumina Abrasive (CR-30), 0.1 mol/1 kg Hydrochloric acid, 0.1 mol/1 kg Ammonium Chloride, and balance of deionized water, at a pH range from about 1 to about 2, typically about 1.4. Composition S was prepared by adding the alumina abrasive (such as CR-30) to a container of DI water, then adding the hydrochloric acid, and then adding the ammonium chloride ($NH_4Cl$). Composition S is advantageously stirred continuously within the container during at least the composition preparation. A 4/0/200/18/70 CMP Process was carried out using an IPEC 576 polisher with a Thomas West XY pad and employing a down force pressure of 4 psi, a back pressure of 0 psi, a table or platen speed of 200 rpm, a carrier speed of 18 rpm, and a composition flow rate of 70 ml/min. Composition S was stirred thoroughly before and during its use. When employed according to the process set forth in Table S, Composition S provides a Pt removal rate of 310 A/min.

Composition T: Comparative platinum polishing compositions (such as "Composition T") comprise an alumina (alpha-, gamma-, or both) abrasive, hydroxylamine (HDA), and DI water. It is believed that the caustic HDA serves as a mild reducing agent. Composition T contained 2 wt % Alpha-Alumina Abrasive (CR-30), 0.1 mol/1 kg Hydroxylamine, and a balance of deionized water, at a pH of from about 8 to about 9, typically about 8.5. Composition T was prepared by adding the alumina abrasive (such as CR-30) to a container of DI water and then adding the hydroxylamine, stirring continuously within the container during the composition preparation. A 4/0/50/51/150 CMP Process was carried out using an IPEC 472 polisher and employing a down force pressure of 4 psi, a back pressure of 0 psi, a table speed of 50 rpm, a carrier speed 51 rpm, and a composition flow rate of 150 ml/min. An IC-1000 k-grooved pad was used as the polishing pad on the primary platen of the polisher, and a Polytex pad was used as buff pad on the secondary platen of the polisher. Composition T was stirred thoroughly before and during its use. Composition T provides a Pt removal rate of 209 A/min and a BPSG removal rate of 432 A/min, demonstrating a Pt:BPSG selectivity of 1:2. This was poor selectivity, and these compositions are not useful for most platinum polishing applications.

Composition U: Other Platinum polishing compositions (such as "Composition U") comprise an alumina abrasive (alpha-, gamma-, or both), hydroxylamine hydrochloride ($NH_2OH.HCl$), and DI water. It is believed that the hydroxylamine hydrochloride serves as an oxidizing agent. Composition U contained 2 wt % Alpha-Alumina Abrasive (CR-30), 0.1 mol/1 kg $NH_2OH.HCl$, and a balance of deionized water, at a pH of from about 3.5 to about 4.5, typically about 4. Composition U was prepared by adding the alumina abrasive (such as CR-30) to a container of DI water and then adding the hydroxylamine hydrochloride ($NH_2OH.HCl$), stirring continuously within the container during the composition preparation. A 2/0/200/18/150 CMP Process was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition U is advantageously stirred thoroughly before and during its use. Composition U provides a Pt removal rate of 393 A/min and a BPSG removal rate of 70 A/min, demonstrating a Pt:BPSG selectivity of approximately 5.6:1.

Those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A method of polishing a substrate surface, comprising:
   providing a substrate surface having at least one feature thereon comprising ruthenium and at least one dielectric material,
   providing an aqueous composition comprising from about 0.0005 to about 1 moles/kilogram of periodic acid and from about 0.2% to about 6% by weight of silica abrasive having an average particle size of about 50 nm or less, wherein the aqueous composition is disposed between a polishing pad and the substrate surface; and
   moving the polishing pad relative to the substrate surface, where the removal rate of the ruthenium is at least 300 A/min.

2. The method of claim 1, wherein the substrate comprises a ruthenium feature and at least one of PETEOS dielectric, TEOS dielectric, or BSPG dielectric, and wherein the removal selectivity of the ruthenium to the dielectric is greater than about 20:1.

3. The method of claim 1, wherein the silica abrasive is present in an amount between about 0.2% to about 4% by weight and the periodic acid is present in an amount from about 0.01 to about 0.05 moles/kilogram of aqueous composition.

4. The method of claim 1, wherein the silica abrasive is substantially spherical silica particles with a particle size of about 4 nanometers to about 25 nanometers.

5. The method of claim 1, wherein at least 50% of the weight of the silica should be in a chain-like structure with a length-to-width ratio of at least 4.

6. The method of claim 1, wherein at least 50% of the weight of the silica is in aggregates with an aggregate diameter of about 0.03 to 0.05 microns before polishing.

7. The method of claim 1, wherein the silica abrasive comprises both silica particles in a chain-like structure with a length-to-width ratio of at least 4, and also silica particles in aggregates with an aggregate diameter of about 0.03 to 0.05 microns, and wherein before polishing at least 70% of the weight of the silica is contained in the chain-like structures and the aggregates.

8. The method of claim 1, wherein the substrate further comprises a hard-mask material, and wherein the polishing rate of the hardmask material is equal to or greater than the polishing rate of the ruthenium.

9. The method of claim 1, wherein the aqueous composition consists essentially of water, periodic acid, one or more quaternary amines, and the silica abrasive, and wherein the solution has a pH of about 2 to about 5.

10. The method of claim 1, wherein the polishing process is a one-step process, and the polishing rate of ruthenium is greater than 500 angstroms per minute.

11. The method of claim 1, wherein the composition is free of sources of chloride ions.

12. The method of claim 1, wherein the composition comprises from about 0.3% to 0.7% by weight of periodic acid.

13. The method of claim 1, wherein the composition is free of ferric salts, copper salts, silver salts, and cerium salts.

14. The method of claim 1, wherein the silica is high purity substantially spherical colloidal silica with an average particle diameter of about 7 nanometers in chain form.

15. A method of polishing a substrate surface, comprising:
    providing a substrate surface having at least one feature thereon comprising ruthenium and at least one layer comprising a low-K dielectric material,
    contacting the substrate with a silica abrasive and with an aqueous composition comprising periodic acid and a quaternary amine, wherein the solution has a pH of about 2.5 to about 5; and
    chemically mechanically polishing the substrate surface to remove a portion of the ruthenium, wherein the removal selectivity of the ruthenium to the low-K dielectric is greater than 20:1.

16. The method of claim 15, wherein the silica abrasive is present in an amount between about 0.2% to about 1% by weight and the periodic acid is present in an amount from about 0.01 to about 0.05 moles/kilogram of fluid.

17. The method of claim 15, wherein the substrate comprises at least one of tantalum oxide or titanium oxide, and wherein the polishing rate of the tantalum oxide and/or titanium oxide is between about 0.9 and 1.3 times the polishing rate of ruthenium.

18. The method of claim 15, wherein the pH of the aqueous composition is between about 3 and about 4.

19. A method of polishing a substrate surface, comprising:
    providing a substrate surface having at least one feature thereon comprising ruthenium, at least one feature comprising tantalum oxide, and a dielectric material;
    providing an aqueous composition comprising from about 0.1% to about 3% by weight periodic acid, from about 0.2% to about 6% by weight of silica abrasive having an average particle, size of about 50 nm or less, wherein the aqueous composition is provided between a polishing pad and the substrate surface, and wherein the composition comprises less than about 0.5% of sources of chloride ions; and
    moving the polishing pad relative to the substrate surface, where the polishing rate of tantalum oxide is between about 0.8 and 1.7 times the polishing rate of ruthenium.

20. The method of claim 19, wherein the composition comprises less than about 0.1% of sources of chloride ions.

21. The method of claim 19, wherein the aqueous composition further comprises an amine in an amount sufficient to adjust the pH to between about 3 and about 7.

22. A method of polishing a substrate surface, comprising:
providing a substrate surface having at least one feature thereon comprising a noble metal,
providing an aqueous periodic acid solution having 0.0005 to about 1 moles/kilogram of periodic acid;
adjusting the pH of the aqueous periodic acid to a pH of between about 3 and about 7 with a quaternary amine;
adding from about 0.2% to about 6% by weight of silica abrasive having an average particle size of about 50 nm or less to the pH-adjusted aqueous composition to form a polishing slurry; and
contacting the substrate surface with the polishing slurry.

* * * * *